(12) United States Patent
Chen et al.

(10) Patent No.: US 10,615,320 B2
(45) Date of Patent: Apr. 7, 2020

(54) RECESSED CHIP SCALE PACKAGING LIGHT EMITTING DEVICE AND MANUFACTURING METHOD OF THE SAME

(71) Applicant: MAVEN OPTRONICS CO., LTD., Hsinchu (TW)

(72) Inventors: Chieh Chen, Palo Alto, CA (US); Tsung-Hsi Wang, Hsinchu (TW); Junwei Chung, Kaohsiung (TW)

(73) Assignee: MAVEN OPTRONICS CO., LTD., Hsinchu County (TW)

( * ) Notice: Subject to any disclaimer, the term of this patent is extended or adjusted under 35 U.S.C. 154(b) by 0 days.

(21) Appl. No.: 15/402,087

(22) Filed: Jan. 9, 2017

(65) Prior Publication Data
US 2017/0200870 A1    Jul. 13, 2017

(30) Foreign Application Priority Data

Jan. 12, 2016  (TW) .............................. 105100783 A
Jan. 19, 2016  (CN) .......................... 2016 1 0033392

(51) Int. Cl.
| H01L 33/54 | (2010.01) |
| H01L 33/50 | (2010.01) |
| H01L 33/56 | (2010.01) |
| H01L 33/58 | (2010.01) |
| H01L 33/60 | (2010.01) |
| H01L 33/48 | (2010.01) |

(52) U.S. Cl.
CPC ............ *H01L 33/54* (2013.01); *H01L 33/507* (2013.01); *H01L 33/56* (2013.01); *H01L 33/58* (2013.01); *H01L 33/60* (2013.01); *H01L 33/486* (2013.01); *H01L 2933/005* (2013.01); *H01L 2933/0058* (2013.01)

(58) Field of Classification Search
CPC ....... H01L 33/504; H01L 33/54; H01L 33/60; H01L 33/507; H01L 33/58; H01L 33/56
USPC ...................................... 257/E21.09; 438/26
See application file for complete search history.

(56) References Cited

U.S. PATENT DOCUMENTS

| 9,293,674 B2 | 3/2016 | Kususe et al. |
| 2004/0046242 A1* | 3/2004 | Asakawa ............ H01L 31/0203 |
| | | 257/678 |
| 2008/0213928 A1* | 9/2008 | Harada ................. H01L 33/504 |
| | | 438/26 |

(Continued)

FOREIGN PATENT DOCUMENTS

| CN | 102272954 A | 12/2011 |
| EP | 2 717 334 A2 | 4/2014 |

(Continued)

OTHER PUBLICATIONS

Extended Search Report for EP Patent Application No. 17150793.2, dated May 31, 2017, 8 pages.

(Continued)

*Primary Examiner* — Mouloucoulaye Inoussa
(74) *Attorney, Agent, or Firm* — Foley & Lardner LLP

(57) ABSTRACT

A chip-scale packaging (CSP) LED device, comprising an LED semiconductor die and a packaging structure, is disclosed. The LED semiconductor die is encapsulated by the packaging structure, wherein the lower surface of the packaging structure has a recessed space underneath. A manufacturing method of the CPS LED device is also disclosed.

19 Claims, 20 Drawing Sheets

(56) References Cited

U.S. PATENT DOCUMENTS

| | | | |
|---|---|---|---|
| 2009/0085223 A1* | 4/2009 | Nishiyama | H01L 23/3121 257/777 |
| 2010/0119839 A1 | 5/2010 | Chen | |
| 2012/0068187 A1* | 3/2012 | Odnoblyudov | H01L 33/508 257/76 |
| 2013/0009292 A1 | 1/2013 | Kawasaki | |
| 2013/0187174 A1 | 7/2013 | Tischler | |
| 2013/0187178 A1 | 7/2013 | Tischler | |
| 2014/0225143 A1 | 8/2014 | Kususe et al. | |
| 2015/0091035 A1 | 4/2015 | Kim et al. | |
| 2015/0171281 A1 | 6/2015 | Nakabayashi et al. | |

FOREIGN PATENT DOCUMENTS

| | | |
|---|---|---|
| JP | 2012-124443 A | 6/2012 |
| JP | 2014-154769 A | 8/2014 |
| KR | 2014-0135166 A | 11/2014 |
| TW | 201511353 A | 3/2015 |
| TW | 201537771 A | 10/2015 |

OTHER PUBLICATIONS

Office Action and Search Report for Taiwan Patent Application No. 105100783, dated Oct. 13, 2016, 9 pages.

Office Action and Search Report for corresponding Chinese Patent Application No. 201610033392.0, dated Jun. 1, 2018, 7 pages.

Decision of Refusal for corresponding Japanese Patent Application No. 2017-003282, dated Jul. 10, 2018, 2 pages.

Japanese Office Action for corresponding Japanese Patent Application No. 2017-003282, dated Mar. 6, 2018, 2 pages.

Notice of Allowance for corresponding South Korean Patent Application No. 10-2017-0005046, dated Dec. 18, 2018, 6 pages.

South Korean Office Action for corresponding South Korean Patent Application No. 10-2017-0005046, dated Aug. 27, 2018, 4 pages.

South Korean Office Action for corresponding South Korean Patent Application No. 10-2017-0005046, dated Feb. 27, 2018, 10 pages.

Office Action in corresponding European Patent Application No. 17150793.2, dated Jun. 12, 2019, 7 pages.

* cited by examiner

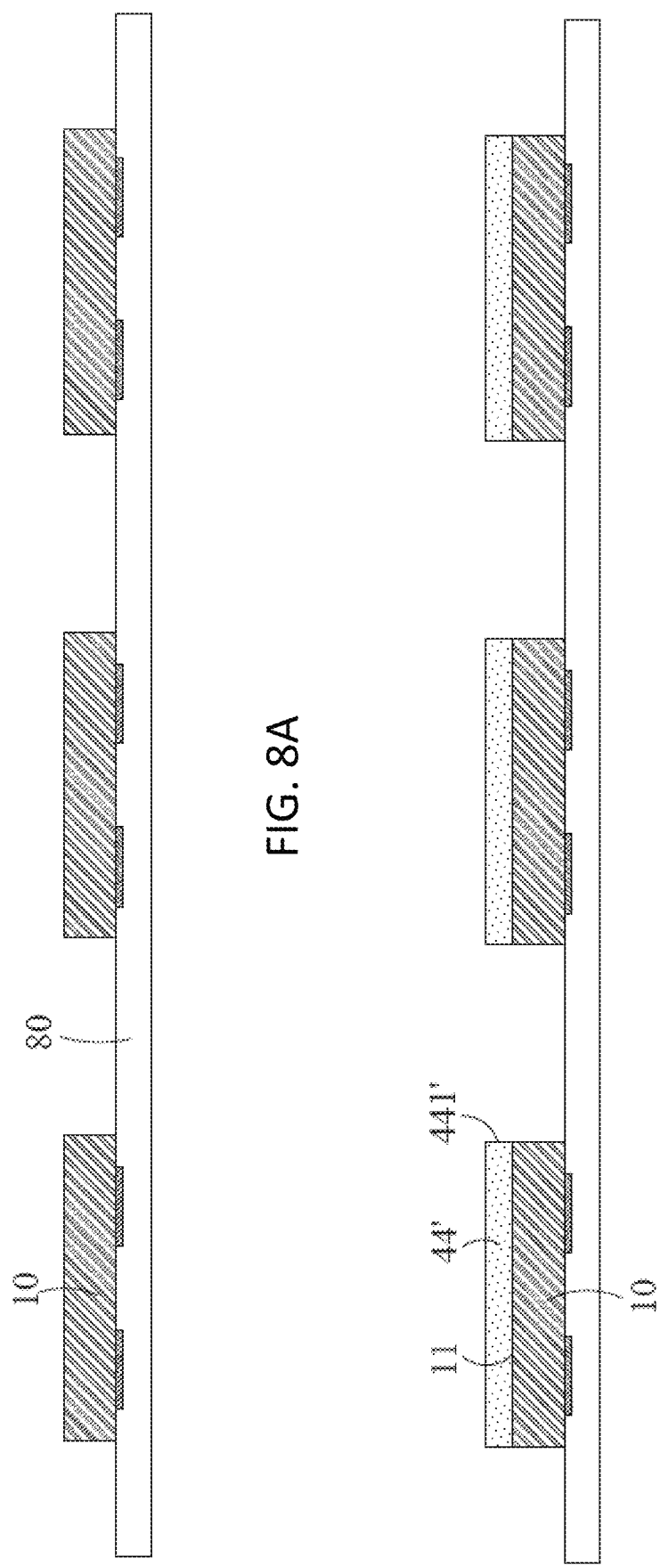

RECESSED CHIP SCALE PACKAGING LIGHT EMITTING DEVICE AND MANUFACTURING METHOD OF THE SAME

CROSS-REFERENCES TO RELATED APPLICATIONS

This application claims the benefit of and priority to Taiwan Patent Application No. 105100783 filed on Jan. 12, 2016, and Chinese Patent Application No. 201610033392.0 filed on Jan. 19, 2016, which also claims priority to the Taiwan Patent Application, the disclosures of which are incorporated herein by reference in their entirety.

BACKGROUND

Technical Field

The present disclosure relates to a light emitting device and the manufacturing method thereof, in particular to a chip-scale packaging light emitting device including a light emitting diode (LED) semiconductor die which generates electromagnetic radiation while it is in operation.

Description of the Related Art

LEDs are widely used in various applications including traffic lights, backlight units, general lightings, portable devices, automotive lighting and so forth. Generally, an LED semiconductor die is disposed inside a package structure, such as a lead frame, to form a packaged LED device. It may further be disposed and covered by photoluminescent materials, such as phosphors, to form a phosphor-converted white LED device.

An LED device is usually attached to a substrate by a bonding process such as reflow soldering, eutectic bonding, or the like, wherein electric energy can be transmitted through bonding pads of an application substrate so that the LED device generates electromagnetic radiation during operation.

Recent development of a chip-scale packaging (CSP) LED device has attracted more and more attention due to its promising advantages. As a typical example, a white-light CSP LED device is generally composed of a blue-light LED semiconductor die and a packaging structure covering the LED semiconductor die in a compact chip-scale size. In comparison with a plastic leaded chip carrier (PLCC) LED device, a CSP light emitting device shows the following advantages: (1) The material cost is considerably less by eliminating the use of a bonding wire and a lead frame. (2) The thermal resistance between a LED semiconductor die and a mounting substrate, typically a printed circuit board (PCB), is further reduced without using a lead frame in between. Therefore the LED operation temperature is lowered while under the same driving current. In other words, less electrical energy can be consumed to obtain more optical power for a CSP LED device. (3) A lower operation temperature provides a higher LED semiconductor quantum efficiency for a CSP LED device. (4) A much smaller form factor of the light source provides more design flexibility for module-level LED fixtures. (5) A CSP LED device having a small light emitting area more resembles a point source and thus makes the design of secondary optics easier. A compact CSP LED device can be designed to generate small-Etendue light with higher optical intensity that is specified for some projected light applications, such as automobile headlights.

Since a CSP LED device, mainly comprising an LED semiconductor die and a packaging structure covering the LED semiconductor die, does not have gold wires and a surface mount lead frame, it is directly attached onto an application substrate, such as a PCB, so that the electrodes of a flip-chip semiconductor die inside the CSP LED device can be electrically connected to bonding pads of an application substrate. The electrodes of the flip-chip LED semiconductor die serve another important function to transfer and dissipate heat generated during operation of the CSP LED device to the application substrate as well. Because an LED semiconductor die is made of inorganic material and a packaging structure is mostly composed of organic resin material covering the LED semiconductor die, the organic packaging structure can have considerably larger thermal expansion than the inorganic LED semiconductor die during a high temperature reflow soldering or an eutectic bonding process. Especially, the packaging structure can expand more in the vertical direction than the LED semiconductor die; in other words, the packaging structure expands more against an underlying bonding substrate so that it "lifts" the electrodes of the inside LED semiconductor die off the underlying bonding substrate, resulting in a void gap between the electrodes of the LED semiconductor die and the bonding pads of the application substrate during a high temperature soldering/bonding process. Consequently, a CSP LED device fails to be properly bonded onto the substrate, resulting in electrical connection failure. Other failure modes may include higher electrical contact resistance resulting in higher LED power consumption, or higher thermal resistance resulting in poor heat dissipation, all due to poor welding of the electrodes of the semiconductor die to the bonding pads of the substrate. Accordingly, the overall efficiency and reliability of a CSP LED device attached to an application substrate are reduced.

In order to improve the aforementioned problem, a possible solution is to place a thick solder bump, such as a gold-tin bump, underneath electrodes of a CSP LED device so that a bottom surface of a packaging structure of the CSP LED device is elevated to a higher position to form a marginal gap between the bottom surface of the packaging structure and an underneath application substrate. This marginal gap is preserved for thermal expansion of the packaging structure during a subsequent soldering/bonding process Thus, even though the packaging structure of the CSP LED device can still be thermally expanded unavoidably in the vertical direction during soldering, it does not touch the application substrate to force the electrodes of the LED semiconductor die being lifted off from the application substrate. However, adding a thick soldering bump can significantly increase the material cost to fabricate a CSP LED device and reduce the manufacturing yield of a bonding process during application due to misalignment.

In view of this, providing a solution to solve the aforementioned deficiencies is needed to facilitate practical applications using CSP LED devices.

SUMMARY

One object according to some embodiments of the present disclosure is to provide a CSP LED device and a manufacturing method thereof, to facilitate more reliable bonding of a CSP LED device to a submount substrate or other application substrates.

To achieve the object above, a CSP LED device according to some embodiments of the present disclosure comprises an LED semiconductor die and a packaging structure. The LED semiconductor die is a flip-chip LED semiconductor die having an upper surface, a substantially in parallel but opposite lower surface, an edge surface and a set of electrodes. The edge surface is formed and extends between the outer rim of the upper surface and that of the lower surface, and the set of electrodes is disposed on the lower surface of the LED semiconductor die. The packaging structure is disposed covering the upper surface and the edge surface of the LED semiconductor die, wherein the packaging structure comprises an upper resin member and a lower resin member. The lower resin member covers the upper surface and the edge surface of the LED semiconductor die, and the upper resin member is disposed and stacked on the lower resin member. A bottom surface of the packaging structure is upwardly warped to form a recessed space underneath.

To achieve the object above, another CSP LED device according to some embodiments of the present disclosure comprises an LED semiconductor die and a packaging structure. The LED semiconductor die is a flip-chip LED semiconductor die having an upper surface, a lower surface, an edge surface and a set of electrodes. The edge surface is formed and extends between the outer rim of the upper surface and that of the lower surface, and the set of electrodes is disposed on the lower surface of the LED semiconductor die. The packaging structure comprises a single-layered resin member covering the upper surface and the edge surface of the LED semiconductor die, wherein the bottom surface of the single-layer resin member is upwardly warped to form a recessed space underneath.

To achieve the object above, a manufacturing method of the CSP LED device according to some embodiments of the present disclosure comprises: covering an upper surface and an edge surface of a flip-chip LED semiconductor die with a resin material; solidifying the resin material by thermal curing to form a packaging structure having an upwardly warped bottom surface due to contraction of the resin material.

The CSP LED device of some embodiments of the present disclosure and the manufacturing method thereof can provide at least the following benefits. Because the packaging structure (the resin member) of the CSP LED device has an upwardly warped bottom surface to form a recessed space underneath, when the CSP LED device is attached onto a submount substrate (or other application substrates) using a reflow soldering process or an eutectic bonding process, the packaging structure is therefore heated and thermally expanded to force its bottom surface deform downwardly. However, a recessed bottom surface of the CSP LED device provides a space to accommodate downward expansion of the bottom surface during a higher temperature bonding process. This technical feature can prevent the electrodes of the CSP LED device from lifting off to form a void gap between the electrodes of the LED semiconductor die and the bonding pads of an application substrate, causing a soldering contact failure. Therefore, the set of electrodes of the CSP LED device having a recessed feature according to some embodiments of the present disclosure can be reliably connected electrically to the application substrate through reflow soldering, eutectic bonding or other bonding processes, so that poor or failed electrical connection between the CSP LED device and the substrate can be avoided.

Furthermore, good bonding quality can reduce thermal resistance between a CSP LED device and an application substrate, so that the CSP LED device has a lower junction temperature during operation. Therefore, reliability of the CSP LED device can be greatly improved. Also, a lower junction temperature provides an LED semiconductor die with higher quantum efficiency during operation. Additionally, a good bonding quality can reduce Ohmic contact between a CSP LED device and an application substrate as well, resulting in a lower forward voltage. Thus overall power loss is reduced and higher luminous efficacy is obtained.

Other aspects and embodiments of the disclosure are also contemplated.

The foregoing summary and the following detailed description are not meant to restrict the disclosure to any particular embodiment but are merely meant to describe some embodiments of the disclosure.

BRIEF DESCRIPTION OF THE DRAWINGS

FIG. 8A, FIG. 8B, FIG. 8C, FIG. 8D, FIG. 8E, and FIG. 8F are schematic drawings of a manufacturing process to fabricate another CSP LED device according to another embodiment of the present disclosure.

DETAILED DESCRIPTION

Definitions

Figure 1A:
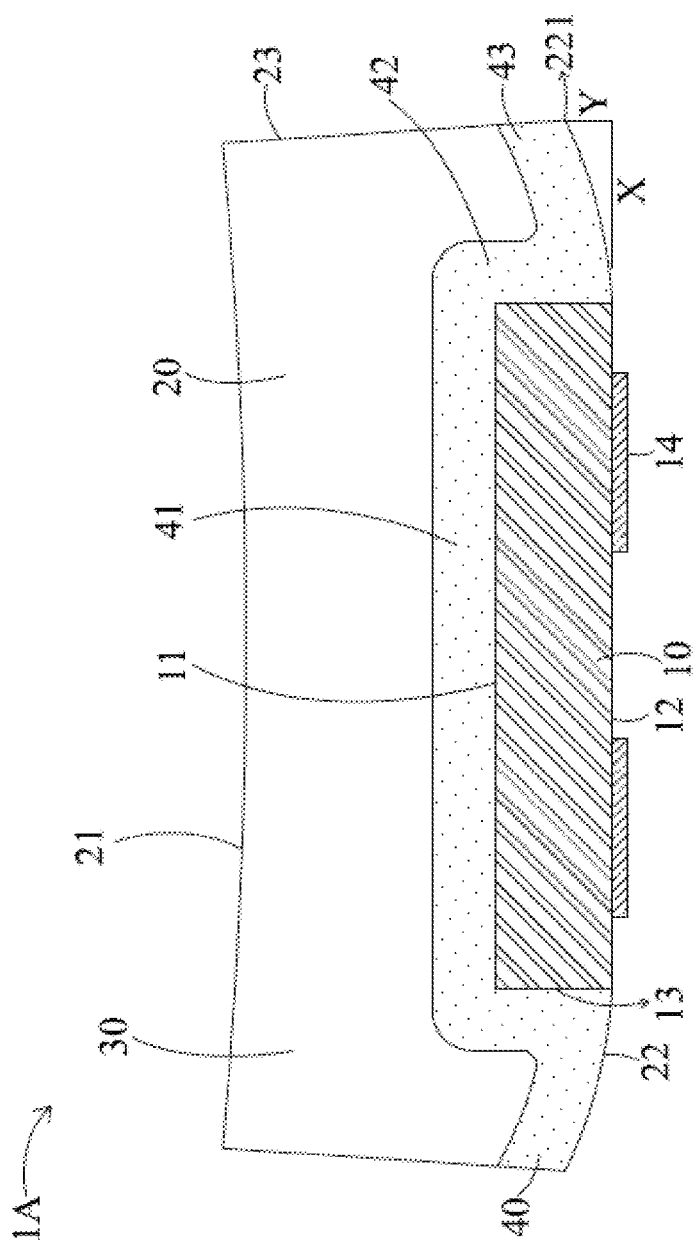
FIG. 1A, FIG. 1B, FIG. 1C, and FIG. 1D are schematic drawings in cross-sectional views depicting a CSP LED device according to an embodiment of the present disclosure.

The following definitions apply to some of the technical aspects described with respect to some embodiments of the disclosure. These definitions may likewise be expanded upon herein.

As used herein, the singular terms "a," "an," and "the" include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another. In the description of some embodiments, a component provided "on" or "on top of" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein with respect to photoluminescence, the term "efficiency" or "quantum efficiency" refers to a ratio of the number of output photons to the number of input photons.

As used herein, the term "size" refers to a characteristic dimension. In the case of an object (e.g., a particle) that is spherical, a size of the object can refer to a diameter of the object. In the case of an object that is non-spherical, a size of the object can refer to an average of various orthogonal dimensions of the object. Thus, for example, a size of an object that is a spheroidal can refer to an average of a major axis and a minor axis of the object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

As shown in FIG. 1A, a first embodiment of a CSP LED device 1A disclosed according to the present disclosure includes a LED semiconductor 10 and a packaging structure 20. The technical contents are described as follows.

The LED semiconductor die 10 is a flip-chip type LED semiconductor die having an upper surface 11, a lower surface 12, an edge surface 13, and a set of electrodes 14. The upper surface 11 and the lower surface 12 are formed substantially in parallel, facing opposite to each other. The edge surface 13 is formed between the upper surface 11 and the lower surface 12, connecting the outer rim of the upper surface 11 with that of the lower surface 12. The set of electrodes 14, or a plurality of electrodes, is disposed on the lower surface 12. Electrical energy is applied to the LED semiconductor die 10 through the set of electrodes 14 so that electro-luminescence is generated. As for the specific structure, an active region that causes electro-luminescence is usually located near a lower position (close to the lower surface 12) of the flip-chip LED semiconductor die 10. Thus, the light generated by the active region will pass through the upper surface 11 and the edge surface 13 to irradiate outwardly. The flip-chip LED semiconductor die 10 accordingly emits the light from the upper surface 11 and the edge surface 13 (four peripheral edge surfaces), namely, forming a five-surface emission LED semiconductor die.

The packaging structure 20 generally serves two functions: 1. protecting the LED semiconductor die 10 from the outside ambient environment, and 2. down-converting the wavelength of the light emitted by the LED semiconductor die 10. Geometrically, the packaging structure 20 has an upper surface 21, a lower surface 22, and an edge surface 23. The upper surface 21 and the lower surface 22 are disposed so as to face opposite to each other, and the edge surface 23 is formed between the upper surface 21 and the lower surface 22, connecting the outer rim of the upper surface 21 with that of the lower surface 22.

Furthermore, the packaging structure 20 is disposed on the LED semiconductor die 10 covering the upper surface 11 and the edge surface 13 of the LED semiconductor die 10 so that the packaging structure 20 protects the LED semiconductor die 10 from being directly exposed to ambient environment to avoid being contaminated or damaged. The upper surface 21 of the packaging structure 20 is spaced apart from the upper surface 11 of the LED semiconductor die 10 and the edge surface 23 of the packaging structure 20 is also spaced apart from the edge surface 13 of the LED semiconductor die 10. Desirably, a photoluminescent material is included inside the space between the upper surface 11 of the LED semiconductor die 10 and the upper surface 21 of the packaging structure 20 so that wavelength of a blue light emitted from the LED semiconductor die 10 through the upper surface 11 can be partially converted by the photoluminescent material. Additionally, the photoluminescent material is desirably included in the space between the edge surface 13 of the LED semiconductor die 10 and the edge surface 23 of the packaging structure 20 so that wavelength of the blue light emitted by the LED semiconductor die 10 through the edge surface 13 can be partially converted by the photoluminescent material. It will be appreciated that the packaging structure 20 does not cover, or at least partially exposes, the lower surface 12 of the LED semiconductor die 10 so that the set of electrodes 14 is exposed for subsequent bonding to an application substrate.

Additionally, the packaging structure 20 comprises an upper resin member 30 and a lower resin member 40. The upper resin member 30 is disposed over and stacked on the lower resin member 40. The lower resin member 40 covers the upper surface 11 and the edge surface 13 of the LED semiconductor die 10 so that the upper resin member 30 does not directly or physically contact the LED semiconductor die 10. An upper surface of the upper resin member 30 is the upper surface 21 of the packaging structure 20 and a lower surface of the lower resin member 40 is the lower surface 22 of the packaging structure 20. An edge surface of the upper resin member 30 and an edge surface of the lower resin member 40 collectively form the edge surface 23 of the packaging structure 20. Light irradiated from the LED semiconductor die 10 will pass through both the lower resin member 40 and the upper resin member 30. Each of the resin members 30 and 40 can optionally include at least one photoluminescent material and/or light scattering particles (e.g., $TiO_2$). For example, the lower resin member 40 can be designed to include the photoluminescent material, and the upper resin member 30 can be designed to include light scattering particles. The upper resin member 30 and the lower resin member 40 may include the same resin material or may include different resin materials.

Therefore, when the blue light irradiated from the LED semiconductor die 10 passes through the lower resin member 40, the wavelength of the blue light generated by the LED semiconductor die 10 can be partially converted by the photoluminescent material. Thus, the light of different wavelengths emitted by the photoluminescent material and the LED semiconductor die 10 may be mixed in a prescribed ratio to generate a light with a desired color, for example, white light of different color temperatures. However, the wavelength of the light does not change while passing through the upper resin member 30 including scattering particles.

The upper resin member 30 and the lower resin member 40 are both formed through thermal curing of resin materials. There are typically two forces causing volumetric contraction of a resin material in a thermal curing process: the first contraction force is caused by chemical reaction, and the second force caused by physical contraction phenomenon during temperature cooling down. Cross-linking of the resin material during thermal curing is a chemical reaction that can result in one-time shrinkage in volume of the resin material. Thermal expansion and contraction of the resin material due to temperature variations is an inherent material property. When the temperature drops from a higher curing temperature, for example about 150° C. to a room temperature, the resin material can have volumetric shrinkage due to material thermal expansion and contraction.

It will be appreciated that when another inorganic material is dispersed inside an organic resin material, the effective Coefficient of Thermal Expansion (CTE) of the entire composite resin material is changed. Thus the overall volumetric shrinkage amount can be changed accordingly. For example, when an inorganic material (e.g., a photoluminescent material) having a lower CTE is dispersed inside a resin material, the overall effective CTE of the composite resin material decreases. The upper resin member 30 or the lower resin member 40 according to the present embodiment may optionally include a photoluminescent material or light scattering particles, whereas the photoluminescent material or the light scattering particle is usually an inorganic material. Therefore, the upper resin member 30 or the lower resin member 40 comprising a photoluminescent material or light scattering particles generally shows a lower effective CTE.

A recessed space underneath the CSP LED device 1A can be formed during the fabrication process of the LED device 1A using a combination of the aforementioned two forces, including volumetric shrinkage caused by chemical reaction and the physical thermal contraction. The details are described as follows.

Figure 1B:
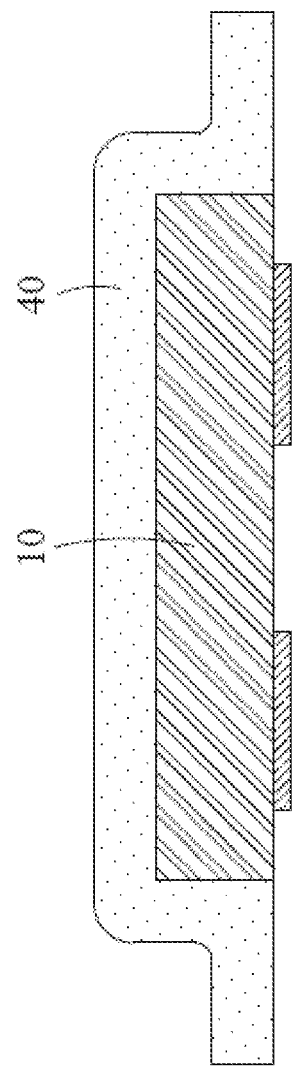

The CSP LED device 1A disclosed in the present embodiment is fabricated mainly in two stages. As shown in FIG. 1B, during the first fabrication stage, the lower resin member 40 is thermally cured and formed on the LED semiconductor die 10. In the second fabrication stage, as shown in FIG. 1C, the upper resin member 30 is disposed on the lower resin member 40, and then cured by heat.

In the first-stage fabrication process of the LED device 1A, as shown in FIG. 1B, the lower resin member 40 is thermally cured and formed on the LED semiconductor die 10. Meanwhile, chemical reaction occurring in the lower resin member 40 will cause a one-time shrinkage in volume. For example, a silicone resin material generally shows volumetric shrinkage of about 6% (linear dimensional shrinkage of about 2%) after a polymerization reaction. On the other hand, the LED semiconductor die 10 is an inorganic material having a CTE of about 6.5 ppm/° C., which is much smaller than that of the silicone resin material (about 200 ppm/° C.) for forming the lower resin member 40. Therefore, volumetric shrinkage of the lower resin member 40 caused by the polymerization reaction of the resin material and by subsequent cooling down from the curing temperature (about 150° C.) to a room temperature (about 25° C.) is much larger than that of the LED semiconductor die 10. Because of the large difference in volumetric shrinkage between the lower resin member 40 and that of the LED semiconductor die 10, the lower resin member 40 having a larger volumetric shrinkage amount will be extended by, or be compressed by, the LED semiconductor die 10 with a smaller volumetric shrinkage amount. The built-in stress developed at the interface will result in shape distortion of the lower resin member 40 itself to make the lower surface deformed upwardly. Therefore a recessed space is formed underneath the lower resin member 40. This is the first main warping mechanism to form a recessed structure of the CSP LED device 1A.

Figure 1C:
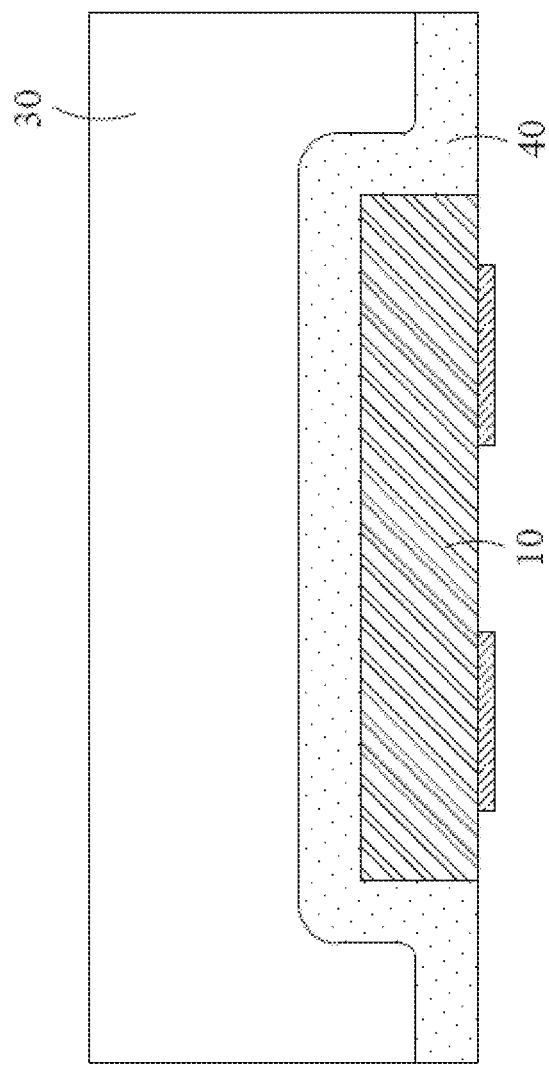
Figure 1D:
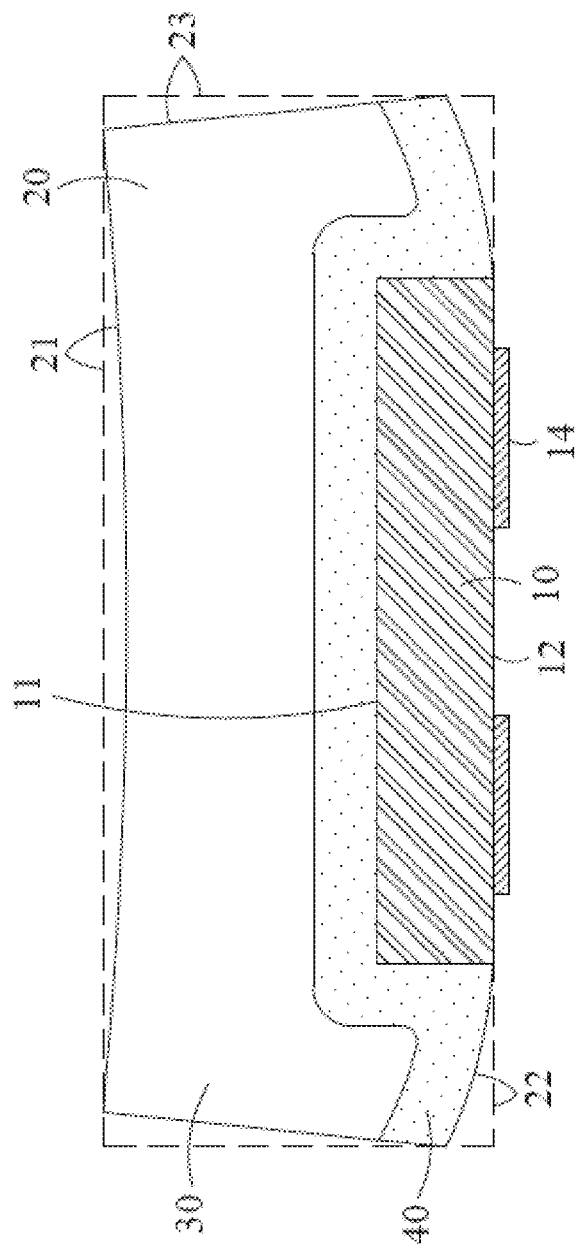

As shown in FIG. 1C, in the second-stage fabrication process of the CSP LED device 1A according to the present embodiment, the upper resin member 30 is formed on the lower resin member 40, and then polymerized by heat. Similarly, the chemical reaction occurring in the upper resin member 30 will cause a one-time volumetric shrinkage, but the already solidified lower resin member 40 does not exhibit another volumetric shrinkage due to another chemical reaction. Thus, the upper resin member 30 will have volumetric shrinkage significantly larger than that of the lower resin member 40; namely the upper resin member 30 will exert a compression stress against the lower resin member 40 along the interface between the upper resin member 30 and the lower resin member 40, causing the lower resin member 40 to deform upwardly. This effect is the so-called Bimorph effect. As shown in FIG. 1D, this Bimorph effect causes the lower surface of the lower resin member 40 to undergo upward warpage, wherein a broken line represents the geometric shape before deformation, and a solid line represents the shape after deformation. That is, the lower surface 22 of the packaging structure 20 is deformed upwardly from the lower surface 12 of the LED semiconductor die 10 (e.g., the lower surface 22 is gradually bent or displaced upwardly from the lower surface 12) to form a recessed shape. This is the second warping mechanism for forming the recessed bottom of the LED device 1A.

Additionally, the lower resin member 40 according to some embodiments of the present disclosure further comprises an inorganic photoluminescent material. Thus the lower resin member 40 has a smaller overall effective CTE because the CTE of the photoluminescent material is much smaller than that of the resin material. It is desirable that the upper resin member 30 does not include a photoluminescent material, thus the overall CTE thereof is higher than that of the lower resin member 40. Therefore, during the fabrication process of forming the LED device 1A according to some embodiments of the present disclosure, the upper resin member 30 having a higher CTE produces volumetric shrinkage larger than that of the lower resin member 40 when the temperature cools down from a higher curing temperature to a room temperature. An interface stress is induced accordingly between the lower resin member 40 and the upper resin member 30 to introduce another Bimorph effect, which in turn results in a larger recessed shape. This is the third main warping mechanism for forming the recessed space underneath the LED device 1A.

It will be appreciated that the three aforementioned warping mechanisms also cause the upper surface of the upper resin member 30 (the upper surface 21 of the packaging structure 20) to deform to a concave curvature, as illustrated in FIG. 1D. Also, the edge surface 23 of the packaging structure 20 is deformed or displaced away from a perpendicular orientation with respect to the lower surface 12 of the LED semiconductor die 10, such that at least a portion of the edge surface 23 forms an angle less than 90° with respect to the lower surface 12, such as 88° or less, 87° or less, 86° or less, or 85° or less.

As a result, the lower surface 22 of the packaging structure 20 is upwardly deformed, so that a recessed space is created underneath the lower surface 22. When the LED device 1A is attached to an application substrate by reflow soldering or eutectic bonding or a similar bonding process, the packaging structure 20 will experience thermal expansion to deform the lower surface 22 downward. However, a pre-recessed space of the lower surface 22 can accommodate an additional thermal expansion of the packaging structure 20 under an elevated temperature condition. Therefore, this technical feature of a recessed structure can effectively resolve a commonly encountered issue associated with a comparative CSP LED device that the set of electrodes 14 of the LED semiconductor die 10 is lifted during an elevated temperature bonding process to cause a void gap between the set of electrodes 14 and bonding pads of an application substrate (not illustrated in FIG. 1D), resulting in either poor or failed soldering joint in between.

Additionally, during a heating process such as reflow soldering or eutectic bonding, the recessed LED device 1A can maintain a proper and consistent soldering gap between the set of electrodes 14 of the LED semiconductor die 10 and pads of an application substrate, so that a solder (not illustrated in FIG. 1D) can fill in the soldering gap with proper thickness and density. In other words, the solder inside the soldering gap will not be squeezed by an external force to cause a void, a discontinuous solder material, or other defects, which results in a poor welding quality, as well as poor thermal conductivity. Therefore, a good welding quality between the CSP LED device 1A and an application substrate results in high thermal conductivity (e.g., low thermal resistance) so that the heat generated by the LED semiconductor die 10 during operation can be rapidly transferred to the application substrate. In this way, the CSP LED device 1A will have a lower junction temperature during operation, which in turn will improve the quantum efficiency, increase reliability, and extend the operation lifetime of the CSP LED device 1A.

Furthermore, a good soldering quality can reduce Ohmic contact between the set of electrodes 14 of the LED semiconductor 10 and bonding pads of an application substrate, therefore reducing the forward voltage to drive the CSP LED device 1A and reducing power loss. Luminous efficacy of the LED device 1A can be improved as well.

In summary, the CSP LED device 1A with a recessed space underneath the lower surface 22 can provide a good welding quality between the LED device 1A and the substrate, so that the LED device 1A shows better reliability performance, higher luminous efficacy, and so forth.

Figure 1E:
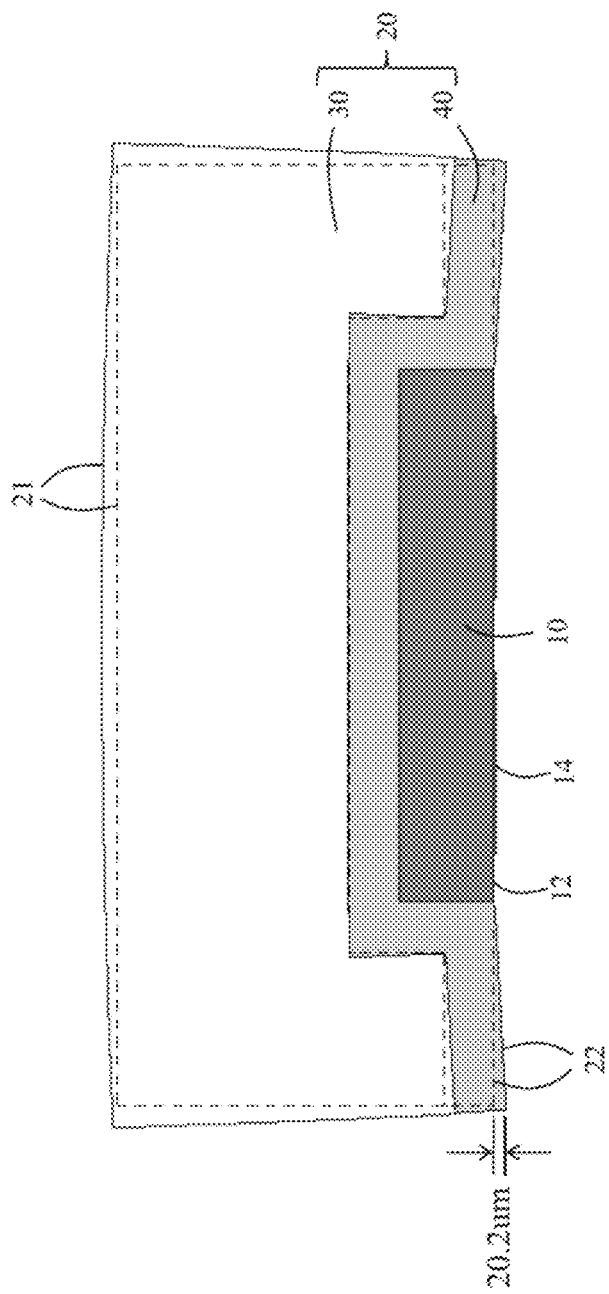
FIG. 1E is a schematic drawing in a cross-sectional view depicting thermal expansion of a comparative CSP LED device.

FIG. 1E shows a simulation result illustrating the effect of thermal expansion of a comparative CSP LED device without a recessed design during a high-temperature environment (about 250° C.) typically found in an eutectic bonding process. In this simulation scenario, the packaging structure 20 has a length of 1500 μm and a thickness of 600 μm, wherein the thickness of the lower resin member 40 is 80 μm. The LED semiconductor die 10 disposed inside the packaging structure 20 has a length of 850 μm and a thickness of 150 μm. When the CSP LED device experiences a high temperature environment such as during an eutectic bonding process, each of the components of the CSP LED device will be deformed due to thermal expansion caused by an elevated temperature. The deformation amount of the packaging structure 20 is much larger than that of the LED semiconductor die 10. In the simulation example shown in FIG. 1E, the dashed line shows the outer envelope of the CSP LED device at room temperature of 25° C., and the solid line shows that of the CSP LED device at a higher temperature of 250° C. It is clearly observed that each resin component of the CSP LED device has a significant shape deformation caused by thermal expansion under the constraint of boundary condition among the components. As a result, the lower surface 22 of the packaging structure 20 is deformed downwardly by 20.2 μm from the horizontal position that was originally aligned with the lower surface 12 of the LED semiconductor die 10 before thermal expansion. This deformation amount will cause the set of electrodes 14 of the LED device 10 to be elevated 20.2 μm vertically, resulting in an excessively large void gap for the solder material to fill between the set of electrodes 14 and pads of a substrate. Thus, a good welding quality using the comparative CSP LED device without a recessed design cannot be guaranteed.

Figure 1F:
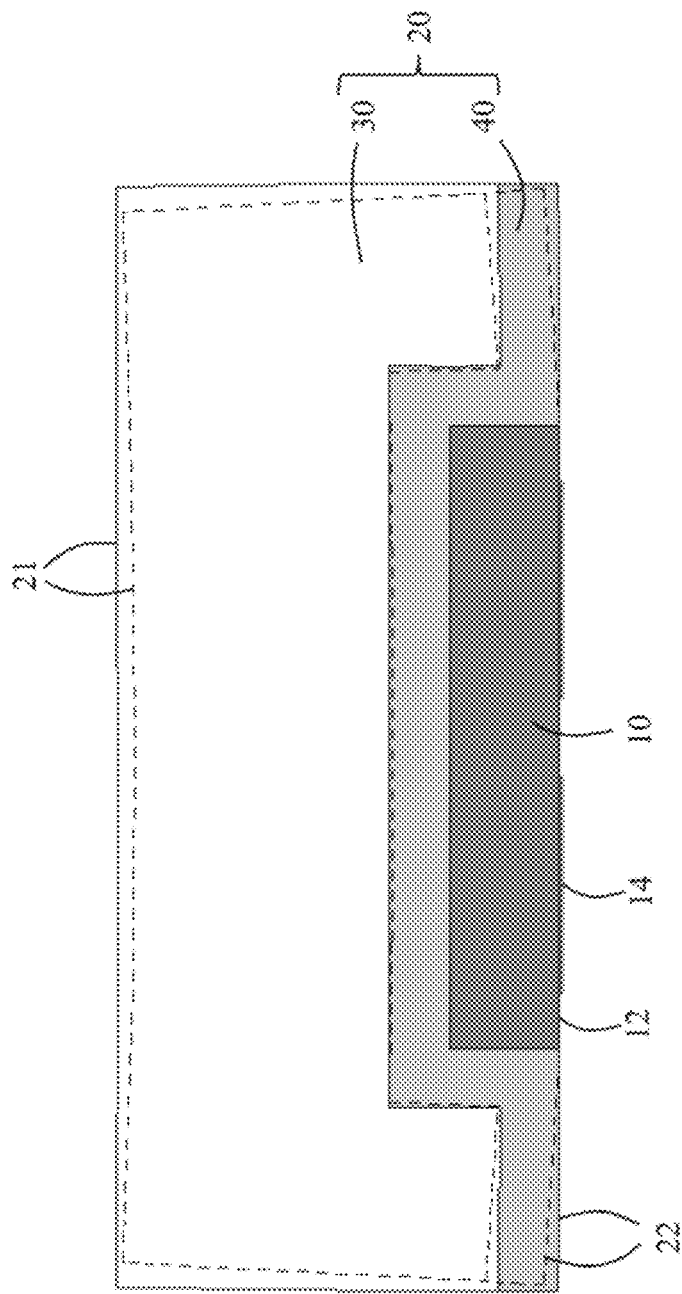
FIG. 1F is a schematic drawing in a cross-sectional view depicting thermal expansion of a CSP LED device according to an embodiment of the present disclosure.

FIG. 1F shows another numerical simulation result illustrating the thermal expansion effect of the recessed LED device 1A according to some embodiments of the present disclosure during the higher temperature bonding process environment, for example 250° C., wherein the geometric dimensions of the CSP device 1A are the same as those of the comparative device shown in FIG. 1E. Similarly, the dashed line represents the original outer envelope of the LED device 1A at a room temperature of 25° C., and the solid line represents that of the CSP LED device 1A at a higher temperature of 250° C. At the room temperature of 25° C., the upwardly deformed amount (recessed space) of the lower surface 22 of the packaging structure 20 of the LED device 1A, where the largest recessed gap occurred at the outer rim of the packaging structure 20, is 20.9 μm. During the high temperature (250° C.) bonding process, the LED device 1A is thermally expanded and deformed from the outer envelope defined by the dashed line (25° C.) to the outer envelope represented by the solid line (250° C.). The highest point of lower surface 22 occurred at the outer rim of the packaging structure 20 has a downward deformation of 19.5 μm. Since the downward deformation amount (19.5 μm) of the packaging structure 20 is less than the recessed space (20.9 μm) built-in underneath the LED device 1A, the lower surface 22 will not lift off the set of electrodes 14, and will not result in an excessively enlarged void gap between the set of electrodes 14 and bonding pads of an application substrate. Therefore, a good welding contact quality using the LED device 1A can be achieved accordingly.

Further, the wetting area (solder joint area) of a solder material disposed between the set of electrodes 14 of the LED semiconductor die 10 and the pads of the substrate will reflect the welding quality. Generally, the larger the wetting area of a solder, the better is the welding quality. This is a result of a larger soldering area for the CSP LED device 1A allowing a lower thermal resistance between the set of electrodes 14 and the bonding pads of the application substrate, such that the heat can be effectively transferred to the application substrate by conduction to avoid heat from accumulating inside the CSP LED device 1A. As an example to illustrate the effect of the solder wetting area on the CSP device temperature, as shown in Table 1, where the wetting area is measured by X-ray inspection. When the solder wetting area is less than about 70% of the electrode area (Test Condition 1) to represent a poor solder joint quality scenario, the temperature measured on the upper surface of the LED device is greater than 110° C. When the solder wetting area is greater than about 95% of the electrode area (Test Condition 3) to represent a better heat dissipation scenario for the CSP LED device, the temperature measured on the upper surface of the LED device is less than 105° C. Under the same test conditions, the temperature measured on the upper surface 21 of the LED device 1A having a recess design is 103° C., which is less than that of the Test Condition 3 (wetting area larger than about 95%). These test results show that the recess design of some embodiments of the present disclosure can significantly improve the welding quality, thereby reducing thermal resistance and the operating temperature.

TABLE 1

Comparison of the measured upper surface temperatures of CSP LED devices with different wetting areas:

| Item | Wetting area | Temperature on upper surface of CSP LED device |
| --- | --- | --- |
| Test Condition 1 using Comparative CSP LED Device | <70% | >110° C. |
| Test Condition 2 using Comparative CSP LED Device | 70%~95% | 105° C.~110° C. |
| Test Condition 3 using Comparative CSP LED Device | >95% | <105° C. |
| Test Condition 3 using Recessed CSP LED device | >98% | 103° C. |

To achieve improved welding quality, the lower surface 22 of the LED device 1A is designed to preserve a certain amount of upward deformation (recessed space underneath). Referring to FIG. 1A, a desirable recessed space underneath the lower surface 22 is specified as follows: the recessed lower surface 22 of the LED device 1A has a rim edge 221. The rim edge 221 is spaced apart from the edge surface 13 of the semiconductor die 10 with a horizontal distance X, as well as being spaced apart from the lower surface 12 of the semiconductor die 10 (or the lowest point of the lower surface 22) with a vertical distance Y. It is desirable that the ratio of vertical distance Y divided by horizontal distance X (Y/X) is equal to or greater than about 0.022 for the CSP LED device 1A according to some embodiments of the present disclosure, such as about 0.025 or greater, about 0.03 or greater, or about 0.035 or greater.

Furthermore, the geometric dimensions of the packaging structure 20 can affect the recessed amount of the lower surface 22 during a fabrication process of the CSP LED Device 1A. When the horizontal dimension (width or length) of the packaging structure 20 is increased, the recessed amount of the lower surface 22 (e.g., the vertical distance Y) is increased accordingly after the packaging structure 20 is thermally cured. When the vertical dimension (thickness) of the packaging structure 20 is increased, the recess amount of the lower surface 22 (e.g., vertical distance Y) will also be increased accordingly after the packaging structure 20 is thermally cured.

However, the incrementally increased recessed amount of the lower surface 22 will gradually saturate when the thickness of the packaging structure 20 has been increased to a certain extent. This is because the upper surface 21 of the packaging structure 20 will be further away from the lower surface 22 by increasing the thickness of the packaging structure 20, and therefore the shrinkage of the top portion of the packaging structure 20 will have a lesser effect on the deformation of the lower surface 22. It is desired that the upper surface 21 of the packaging structure 20 has a distance ranging from about 50 μm to about 1000 μm away from the upper surface 11 of the LED semiconductor die 10 to achieve a better overall benefit.

Additionally, in the present embodiment of the CSP LED device 1A, both the upper resin member 30 and the lower resin member 40 allow light to pass through, and each of them may optionally include at least a photoluminescent material and/or light scattering particles (such as $TiO_2$). For example, the lower resin member 40 is designed to include a photoluminescent material, but the upper resin member 30 is designed not to include a photoluminescent material nor light scattering particles. Thus, when the light emitted from the LED semiconductor die 10 passes through the lower resin member 40, the photoluminescent material can convert the wavelength of the light. However, the upper resin member 30 will not convert the wavelength of the light. Furthermore, the upper resin member 30 or the lower resin member 40 may be formed either as a single-layered structure (as shown in FIG. 1A, which is formed through solidifying the composition material by a single curing process) or a multi-layered structure (not illustrated in FIG. 1A, which is formed through solidifying the composition material(s) by multiple curing processes).

Geometrically, an example embodiment of the lower resin member 40 is described as follows. The lower resin member 40 includes a top portion 41, an edge portion 42, and an extension portion 43. All of the three portions can be formed simultaneously in a single fabrication process. Specifically, the top portion 41 is disposed over the upper surface 11 of the LED semiconductor die 10, the edge portion 42 covers the edge surface 13 of the LED semiconductor die 10, and the extension portion 43 extends outwardly from the edge portion 42 (e.g., extending in a direction away from the edge surface 13). The edge portion 42 and the extension portion 43 are both in rectangular shape surrounding the LED semiconductor die 10.

The aforementioned paragraphs are detailed descriptions of the embodiment related to the LED device 1A. Detailed descriptions of other embodiments of LED devices according to the present disclosure are explained as follows. It will be appreciated that some detailed descriptions of the features and advantages found in the following embodiments of the LED devices are similar to those of the LED device 1A and are therefore omitted for the purpose of brevity.

Figure 2:
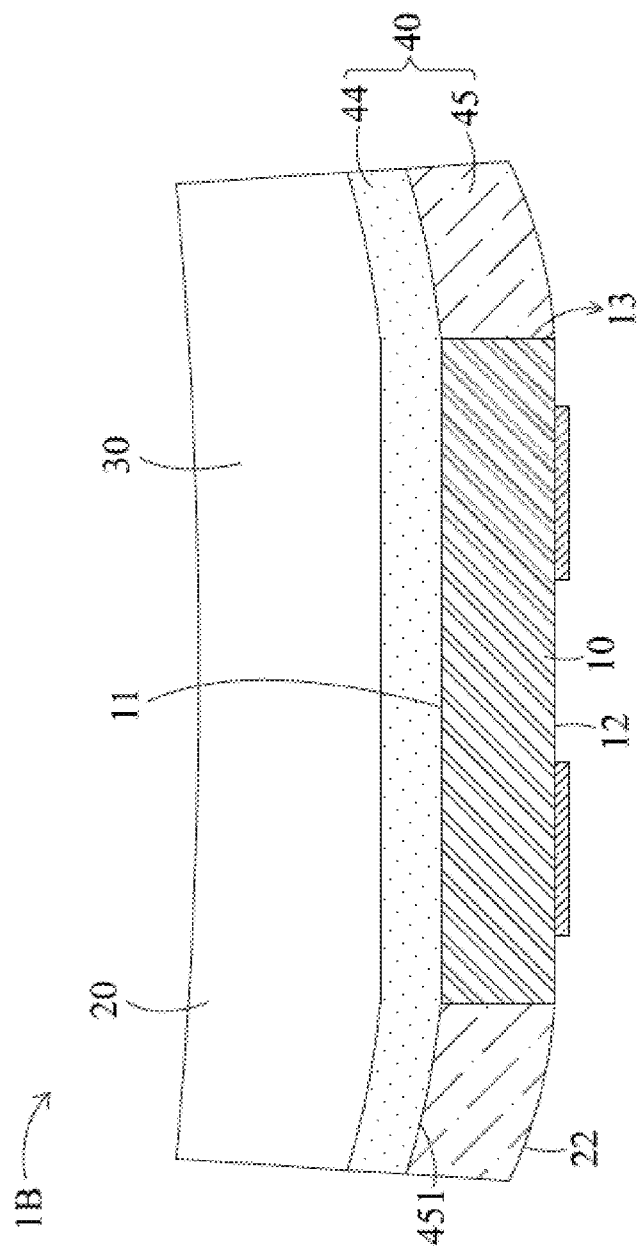
FIG. 2 is a schematic drawing in a cross-sectional view depicting a CSP LED device according to another embodiment of the present disclosure.

FIG. 2 shows a schematic drawing in a cross-sectional view of a CSP LED device 1B according to another embodiment of the present disclosure. A difference between the LED device 1B and the LED device 1A is at least that the lower resin member 40 of the LED device 1B includes a light-transmitting resin member 44 and a reflective resin member 45. The light-transmitting resin member 44 may be a transparent resin member optionally including a photoluminescent material or light scattering particles. The reflective resin member 45 covers the edge surface 13 of the LED semiconductor die 10 but does not cover the upper surface 11. The light-transmitting resin member 44 covers both the upper surface 11 of the LED semiconductor die 10 and an upper surface 451 of the reflective resin member 45. Herein, the lower surface 22 of the reflective resin member 45 of the CSP LED device 1B, resembling the lower surface 22 of the packaging structure 20 of the CSP LED device 1A, is deformed upwardly relative to the lower surface 12 of the LED semiconductor die 10.

Since the reflective resin member 45 covers the edge surface 13, the light emitted toward the edge surface 13 of the semiconductor die 10 will be reflected back and can primarily or solely be escaped from the upper surface 11 eventually. Thus the spatial light irradiation of the LED device 1B is restricted to a relatively smaller viewing angle. Therefore, the CSP LED device 1B is suitable for applications specifying projected light sources.

Figure 3:
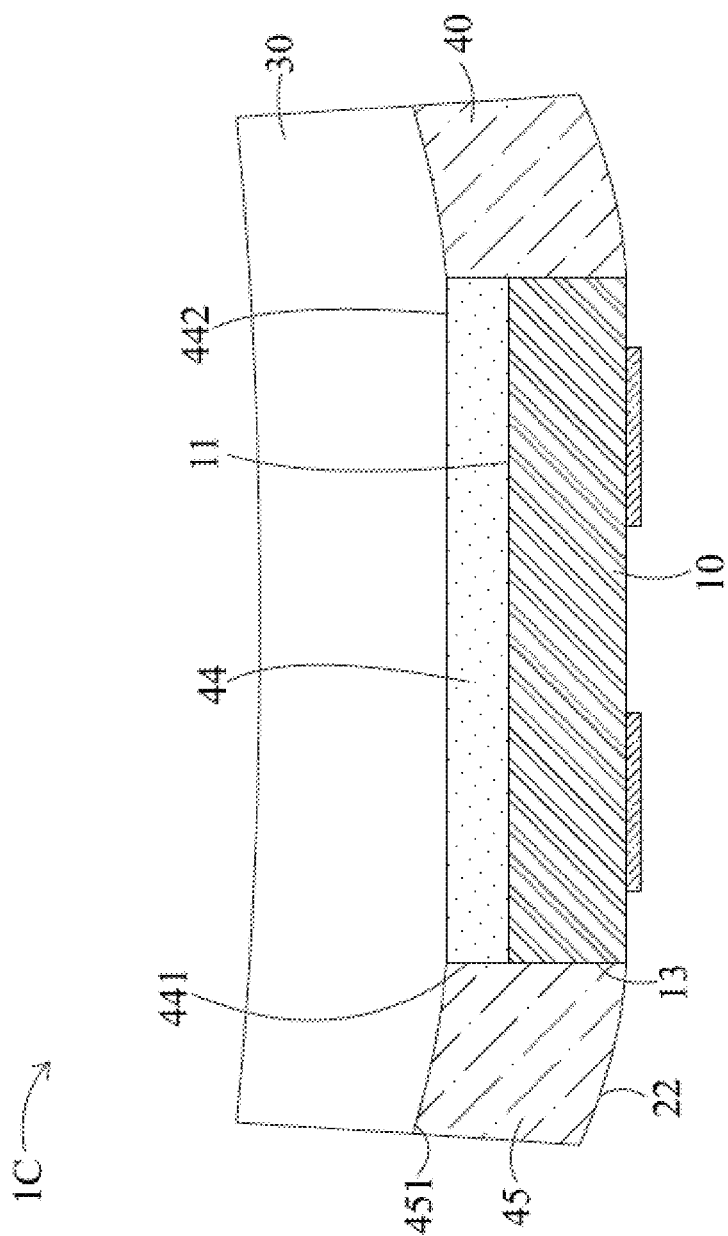
FIG. 3 is a schematic drawing in a cross-sectional view depicting a CSP LED device according to another embodiment of the present disclosure.

FIG. 3 shows a schematic drawing in a cross-sectional view of a CSP LED device 1C according to another embodiment of the present disclosure. A difference between the LED device 1C and the LED device 1B is that the light-transmitting resin member 44 is disposed on the upper surface 11; whereas the reflective resin member 45 covers both the edge surface 13 of the LED semiconductor die 10 and an edge surface 441 of the light-transmitting resin member 44. Thus, the reflective resin member 45 can further prevent light from escaping through the edge surface 441 of the light transmitting resin member 44. Therefore, the spatial light irradiation of the CSP LED device 1C can further be restricted to an even narrower viewing angle. The color uniformity over various viewing angles can be further improved with the embodiment of the CSP LED device 1C compared with that of the CSP LED device 1B.

Figure 4:
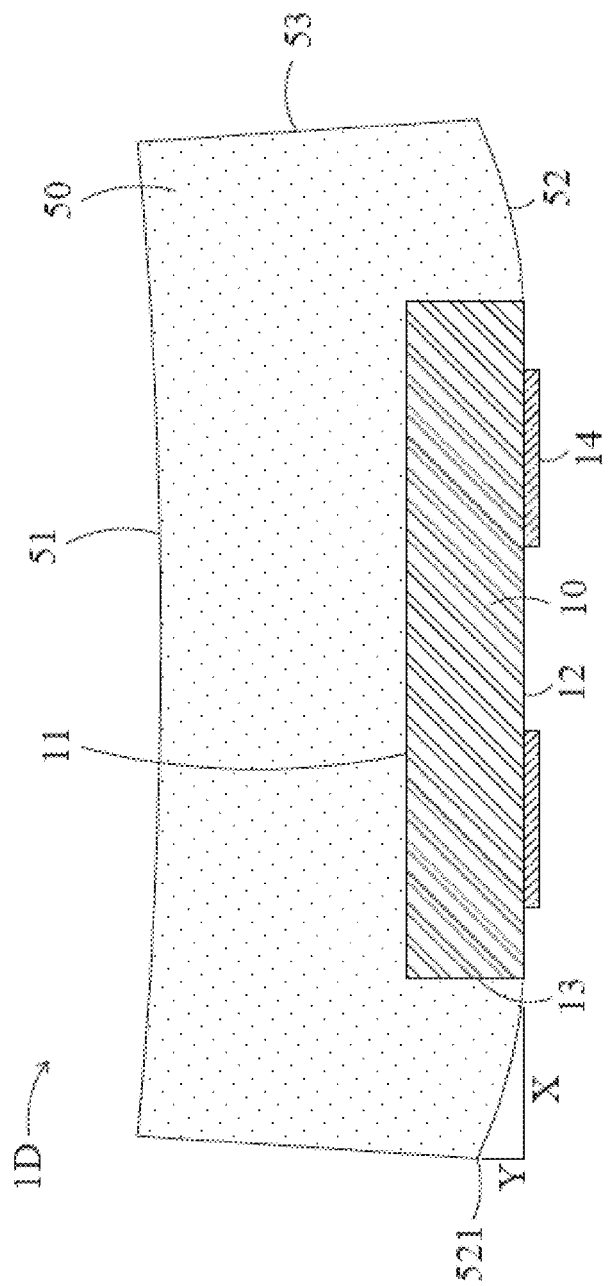
FIG. 4 is a schematic drawing in a cross-sectional view depicting a CSP LED device according to another embodiment of the present disclosure.

FIG. 4 shows a schematic drawing in a cross-sectional view of a CSP LED device 1D according to another embodiment of the present disclosure. The light-emitting device 1D includes an LED semiconductor die 10 and a single-layered resin member 50, wherein the single-layered resin member 50 has a similar function as the packaging structure 20 of the aforementioned LED device 1A. However, the single-layered resin member 50 of the CSP LED device 1D has one single layer of resin material; whereas the packaging structure 20 of the CSP LED device 1A has at least two layers of resin materials, namely, the upper resin member 30 and the lower resin member 40.

The single-layered resin member 50 comprises an upper surface 51, a lower surface 52 and an edge surface 53. The upper surface 51 and the lower surface 52 are formed substantially in parallel, facing opposite to each other. The edge surface 53 is formed and extends between the upper surface 51 and the lower surface 52, connecting the outer rim of the upper surface 51 with that of the lower surface 52.

The single-layered resin member 50 is disposed over the LED semiconductor die 10, covering the upper surface 11 and the edge surface 13 of the LED semiconductor die 10. Thus another function of the single-layered resin member 50 is to protect the LED semiconductor die 10 from being directly exposed to the ambient environment so that contamination or damage is avoided. The upper surface 51 of the single-layered resin member 50 is spaced apart from the upper surface 11 of the LED semiconductor die 10. Similarly, the edge surface 53 of the single-layered resin member 50 is spaced apart from the edge surface 13 of the LED semiconductor die 10.

Desirably, a photoluminescent material is included inside the single-layered resin member 50 so that wavelength of the blue light emitted from the upper surface 11 and the edge surface 13 of the LED semiconductor die 10 can be partially converted by the photoluminescent material. In this way, the light of various wavelengths down-converted by the photoluminescent material and generated by the LED semiconductor die 10 may be mixed in a prescribed ratio to generate a light of a desired color, such as white light of various color temperatures. It will be appreciated that the single-layered resin member 50 does not cover, or at least partially exposes, the lower surface 12 of the LED semiconductor die 10 so that the set of electrodes 14 is exposed for subsequent bonding to an application substrate.

For the LED device 1D according to the present embodiment, the single-layered resin member 50 is mostly composed of an organic resin material. One-time volumetric shrinkage in the single-layer resin member 50 will occur due to chemical polymerization reaction during the elevated temperature curing process. Again, the LED semiconductor die 10 is comprised of inorganic materials, having a CTE considerably smaller than that of the organic material forming the single-layered resin member 50. Thus during the cooling process after thermal curing, the volumetric shrinkage of the single-layered resin member 50 caused by the physical phenomenon of thermal contraction is considerably larger than that of the LED semiconductor die 10.

Therefore, the volume shrinkage of the single-layered resin member 50 is much larger than that of the LED semiconductor die 10 combining both forces due to 1) physical phenomenon of material contraction caused by cooling down temperature, and 2) chemical phenomenon of material contraction caused by polymerization reaction. Therefore, the lower surface 52 will deform upwardly to form a recessed space accordingly, similar to the aforementioned first main warping mechanism for forming a recessed space underneath of the CSP LED device 1A. In other words, the lower surface 52 is deformed upwardly from the lower surface 12 of the LED semiconductor die 10 (or from the lowest point of the lower surface 52). Simultaneously, the shrinkage of the resin material will form a concavity in the upper surface 51 of the single-layered resin member 50, as illustrated in FIG. 4.

Quantitatively, the recessed shape of the lower surface 52 is specified as follows: the recessed lower surface 52 has an outer rim edge 521. This rim edge 521 is spaced apart from the edge surface 13 of the semiconductor die 10 with a horizontal distance X, and spaced apart from the lower surface 12 of the semiconductor die 10 (or from the lowest point of the lower surface 52) with a vertical distance Y. Desirably, the ratio of the vertical distance Y to the horizontal distance X (i.e. Y/X) is equal to or greater than about 0.022, such as about 0.025 or greater, about 0.03 or greater, or about 0.035 or greater.

Another simulation result is used to illustrate the thermal expansion behavior of the CSP LED device 1D with the same device parameters (geometric dimensions, CTEs, and so forth) as the CSP LED device 1A according to the first embodiment under the comparable resin curing temperature conditions. After fabricating the CSP LED device 1D, the simulation results show that the lower surface 52 of the single-layered resin member 50 is built-in with an upwardly recessed distance of 17.8 μm at a room temperature of 25° C. When the CSP LED device 1D experiences a higher bonding/soldering temperature at 250° C., the lower surface 52 of the single-layered resin member 50 will be thermally expanded and deform downward by 17.0 μm. Because the downward expansion amount is less than the recessed distance, thermal expansion of the lower surface 52 will not lift off the set of electrodes 14 from bonding pads of a substrate. Thus a good bonding quality between the LED device 1D and the substrate is ensured.

Similar to the CSP LED device 1A of the first embodiment, the incrementally increased recessed amount of the lower surface 52 will become saturated when the thickness of the single-layered resin member 50 is increased. Therefore, the desirable distance from the upper surface 51 of the single-layered resin member 50 to the upper surface 11 of the LED semiconductor die 10 is about 50 μm to about 1000 μm to achieve an effective overall benefit.

Figure 5:
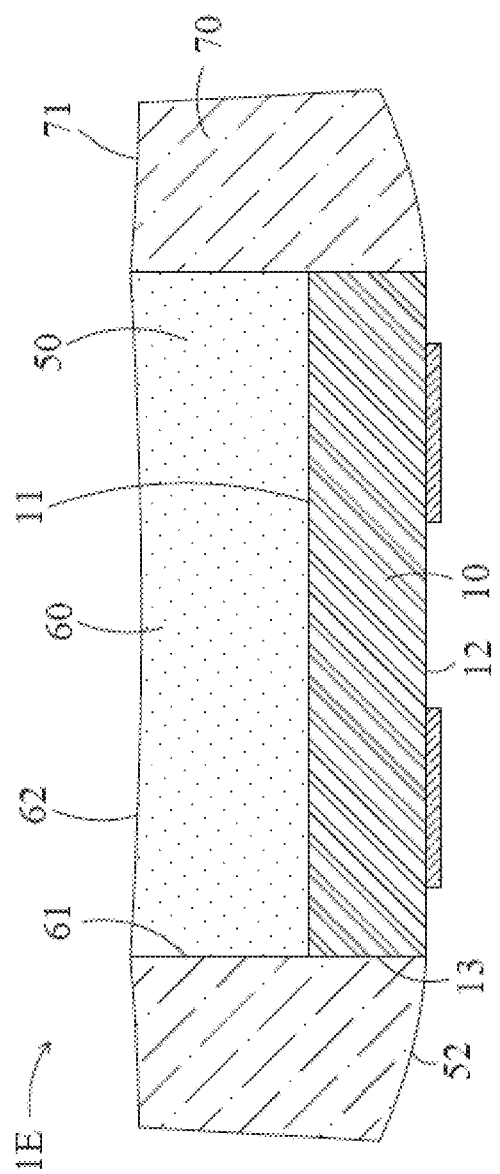
FIG. 5 is a schematic drawing in a cross-sectional view depicting a CSP LED device according to another embodiment of the present disclosure.

FIG. 5 shows a schematic drawing in a cross-sectional view of a CSP LED device 1E according to another embodiment of the present disclosure. A difference between the LED device 1E and the CSP LED device 1D is that the packaging structure resin member 50 of the CSP LED device 1E includes a light-transmitting resin member 60, and further includes a reflective resin member 70. The light-transmitting resin member 60 selectively covers the upper surface 11 of the LED semiconductor die 10, and the reflective resin member 70 covers and adjoins both the edge surface 13 of the LED semiconductor die 10 and an edge surface 61 of the light-transmitting resin member 60.

Since the reflective resin member 70 covers both the edge surface 13 of the LED semiconductor die 10 and the edge surface 61 of the light-transmitting resin member 60, light travelling toward the edge surface 13 and the edge surface 61 will be reflected back and eventually escapes primarily or solely from an upper surface 62. Thus the light irradiation of the LED device 1E can be restricted to a narrower spatial range, resulting in a smaller viewing angle.

Figure 6:
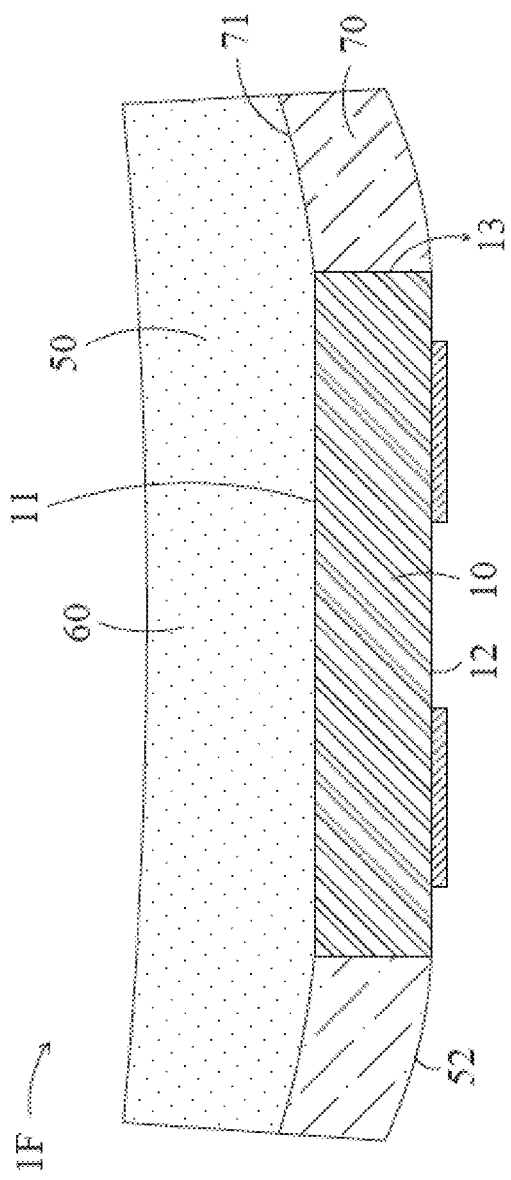
FIG. 6 is a schematic drawing in a cross-sectional view depicting a CSP LED device according to another embodiment of the present disclosure.

FIG. 6 is a schematic drawing in a cross-sectional view of a CSP LED device 1F according to another embodiment of the present disclosure. A difference between the CSP LED device 1F and the CSP LED device 1E is that the reflective resin member 70 of the CSP LED device 1F selectively covers the edge surface 13 of the LED semiconductor die 10, whereas the light-transmitting resin member 60 of the CSP LED device 1F covers both the upper surface 11 of the LED semiconductor die 10 and an upper surface 71 of the reflective resin member 70.

In summary, the CSP LED devices 1A to 1F of some embodiments according to the present disclosure can achieve various desirable optical properties, by embodying a common technical feature: an upwardly warped lower surface 22 or 52 to form a recessed space underneath. This design feature of the recessed lower surface for the CSP LED devices 1A to 1F can effectively improve the shortcomings such as poor bonding quality and failed electrical connection between a CSP LED device and an associated application substrate. Therefore better reliability and higher luminous efficacy are achieved accordingly.

A manufacturing method will be described in the following paragraphs to fabricate some embodiments of the CSP LED devices according to the present disclosure. The manufacturing methods to fabricate the CSP LED devices 1A to 1F, respectively, as illustrated from FIG. 1 to FIG. 6 can be similar in principle. It will be appreciated that some detailed descriptions of the variants of the manufacturing methods are therefore omitted for the purpose of brevity.

A manufacturing method of a CSP LED device comprises two main stages: firstly, covering one or more thermal curing resin materials on an upper surface and an edge surface of an LED semiconductor die; and secondly, curing the resin material(s) by a specific heating process to form a packaging structure having an upwardly warped lower surface. The technical contents are further described as follows.

Figure 7A:
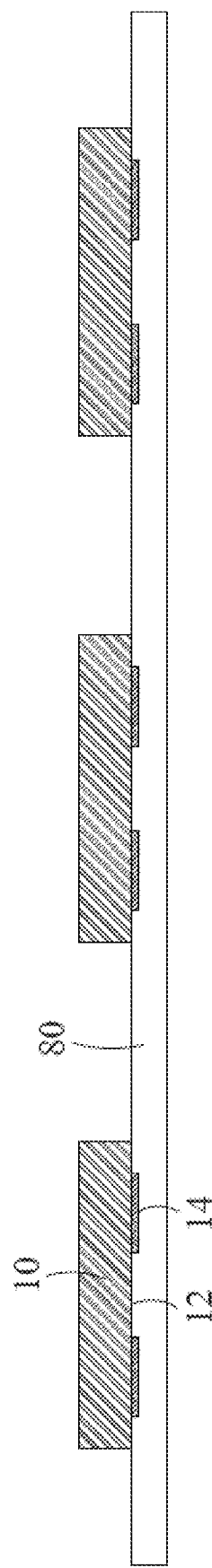
FIG. 7A, FIG. 7B, FIG. 7C, FIG. 7D, and FIG. 7E are schematic drawings of a manufacturing process to fabricate a CSP LED device according to an embodiment of the present disclosure.

FIG. 7A to FIG. 7E show a first embodiment of a manufacturing method according to the present disclosure. As shown in FIG. 7A, a release layer 80, such as a release film, is prepared and can be further disposed onto a carrier substrate, such as a silicon substrate or a glass substrate (not illustrated). Next, an array of LED semiconductor dies 10 is arranged on the release layer 80. It is desirable that the set of electrodes 14 of each of the LED semiconductor die 10 is embedded inside the release layer 80 so that the lower surface 12 of the LED semiconductor die 10 is adhered to and covered by the release layer 80. In this way, the set of electrodes 14 is protected from being contaminated during the subsequent fabrication process.

Figure 7B:
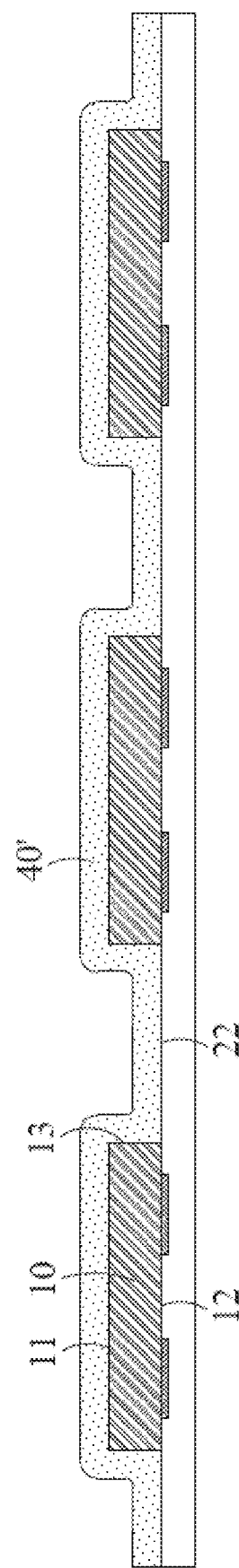

As shown in FIG. 7B, a lower resin member layer 40', corresponding to the manufacturing material of the lower resin member 40 of the LED device 1A shown in FIG. 1A, is then formed using a thermal curing resin material by, for example, spray coating or spin coating, to cover the upper surface 11 and the edge surface 13 of each LED semiconductor die 10. In this fabrication stage, the lower resin member layer 40' is not yet cured (solidified).

The lower resin member layer 40' is then heated to a curing temperature, for example, about 150° C., and kept at this temperature for a certain period of time, so that the lower resin member layer 40' starts to solidify and shrink in volume. After the curing process is completed and the temperature is cooled down to a room temperature, the cured lower resin member layer 40' corresponding to the lower resin member 40 of the LED device 1A shown in FIG. 1A is formed. A built-in interface stress between the lower resin member 40' and the LED semiconductor die 10 is developed, which will form a recessed space through the aforementioned first main warping mechanism after the release layer 80 is removed. Desirably, the lower resin member layer 40' comprises a photoluminescent material, and the methods of forming a phosphor layer disclosed by the U.S. patent publication US2010/0119839 are suitable to this processing stage of forming the lower resin member layer 40', and the technical contents of which is incorporated herein by reference in its entirety.

Figure 7C:
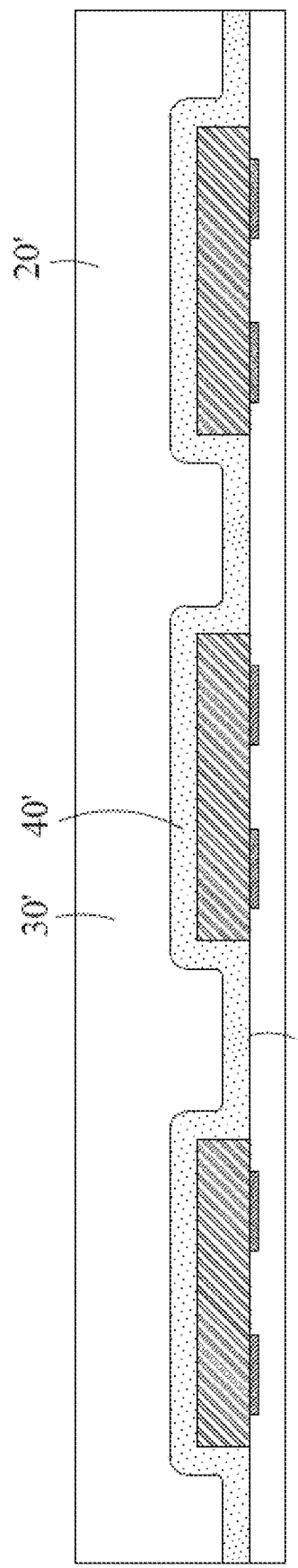

As shown in FIG. 7C, an upper resin member layer 30', corresponding to the upper resin member 30 of the LED device 1A shown in FIG. 1A, is disposed and stacked adjoining the cured lower resin member layer 40' using a thermal curing resin material. In this fabrication stage, the upper resin member layer 30' is not yet cured. This manufacturing stage can be achieved by using a fabrication process such as spray coating, printing, or dispensing.

Next, the upper resin member layer 30' is heated to a desired temperature so that it is thermally cured and shrinks in volume accordingly. After the curing process is completed and the temperature is cooled down to a room temperature, the cured upper resin member layer 30', corresponding to the upper resin member 30 of the CSP LED device 1A shown in FIG. 1A, is formed. In this fabrication stage, a built-in interface stress between the cured upper resin layer 30' and the cured lower resin member layer 40' is developed, which will form a recessed space causing the lower surface 22 of the CSP LED device 1A to be further upwardly deformed after the release layer 80 is removed through the aforementioned second and third main warping mechanisms.

The cured lower resin member layer 40' and the upper resin member layer 30' form an array of connected packaging structures 20' having an upwardly warped lower surface 22, which may correspond to the packaging structure 20 of the LED devices 1A shown in FIG. 1A.

Figure 7D:
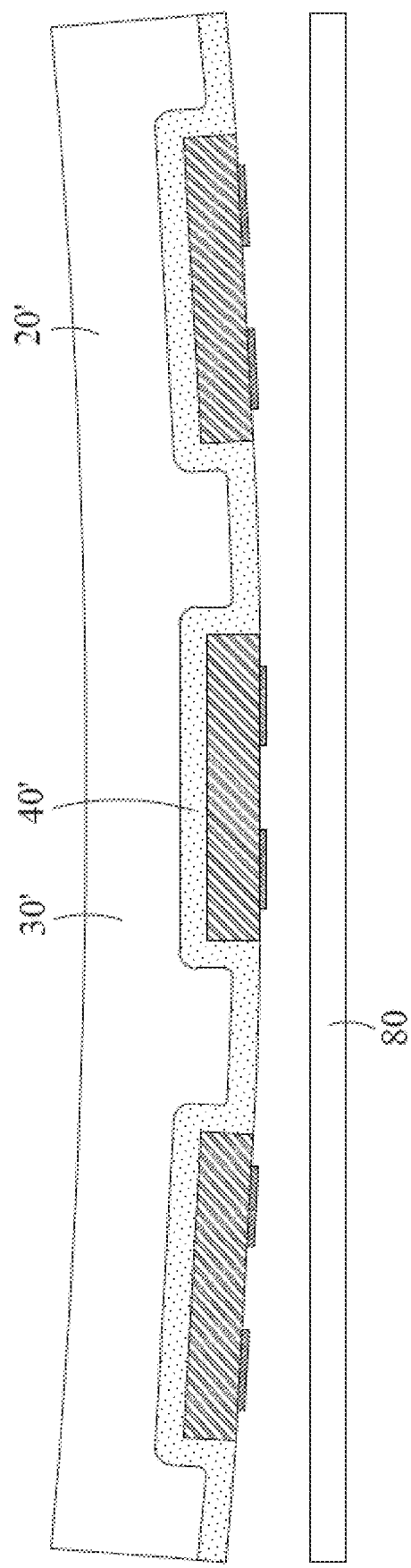
Figure 7E:
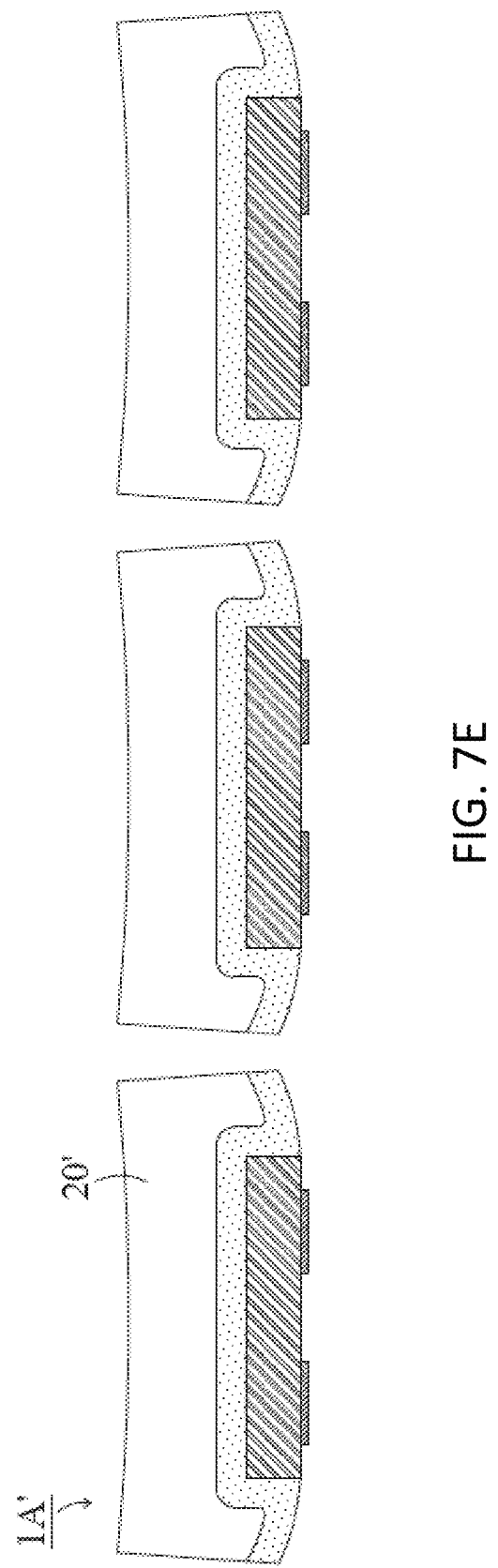

As shown in FIG. 7D, the release layer 80 is removed after the upper resin member layer 30' and the lower resin member layer 40' are sequentially cured. After the stress is released between the lower resin member layer 40' and the release layer 80, the connected array of packaging structures 20' generally shows a concave shape. Last, as shown in FIG. 7E, the connected array of packaging structures 20' is separated by a singulation process, and a plurality of CSP LED devices 1A', corresponding to the CSP LED device 1A shown in FIG. 1A, are obtained.

In summary, to fabricate the LED device 1A', two sequential curing stages are performed to solidify at least two layers of thermal curing resin materials to form a plurality of packaging structures 20' having an upwardly warped lower surface 22.

FIG. 8A to FIG. 8F show a manufacturing method to fabricate another embodiment of the CSP LED device 1C according to the present disclosure.

As shown in FIG. 8A, an array of LED semiconductor dies 10 is arranged on the release layer 80. Next, as shown in FIG. 8B, a plurality of cured light-transmitting resin member materials 44' are disposed to adjoin the upper surfaces 11 of the array of LED semiconductor dies 10. In this fabrication stage, the light-transmitting resin member material 44' can be adhered to the upper surface 11 of each LED semiconductor die 10 through a thermal curing paste (for example, silicone resin, not illustrated), and then the light-transmitting resin member material 44' can be more securely adjoined to the LED semiconductor die 10 through a heating process.

Figure 8C:
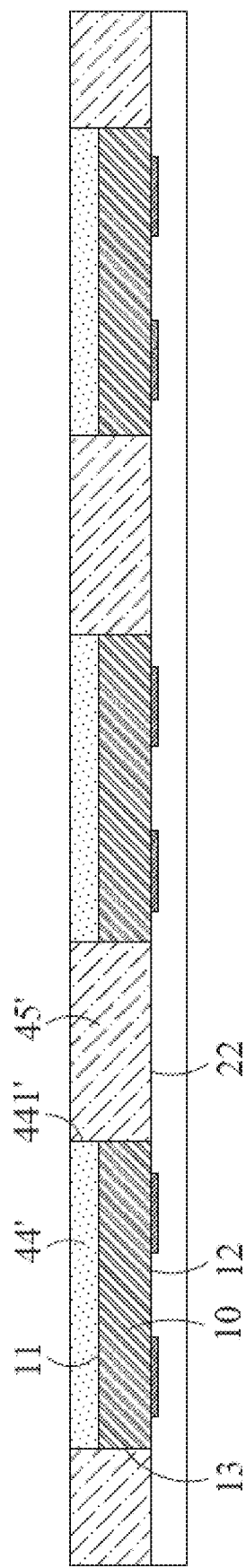

Next, as shown in FIG. 8C, a liquid reflective resin member material 45' is disposed among grooves of the array to cover the edge surface 13 of each LED semiconductor die 10 and an edge surface 441' of the light-transmitting resin member material 44' (corresponding to the edge surface 441 of the light-transmitting resin member 44 of the LED device 1C shown in FIG. 3). The liquid reflective resin member material 45' is solidified by thermal curing, causing material volumetric shrinkage. The lower surface 22 of the cured reflective resin member material 45', which corresponds to the reflective resin member 45 of the CSP LED device 1C shown in FIG. 3, will be deformed upwardly from the lower surface 12 of the LED semiconductor die 10.

Figure 8D:
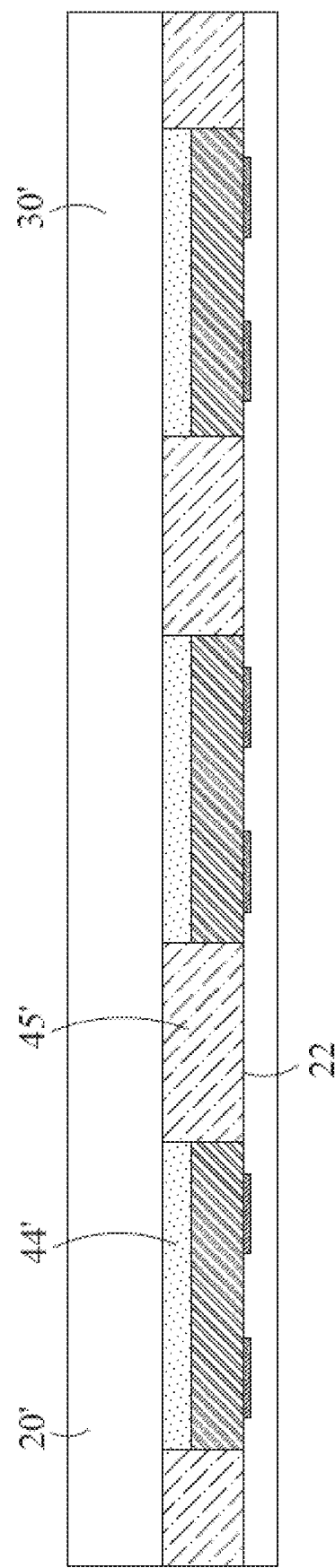

Next, as shown in FIG. 8D, an upper resin member layer 30' is disposed as a supernatant liquid layer overlaying both the cured light-transmitting resin member layer 44' and the cured reflective resin member material 45'. Then, it is thermally cured for solidification, causing volumetric shrinkage accordingly. In this fabrication stage, the lower surface 22 of the reflective resin member material 45' is further deformed upwardly through the aforementioned second and third main warping mechanisms to form a recessed space.

Figure 8E:
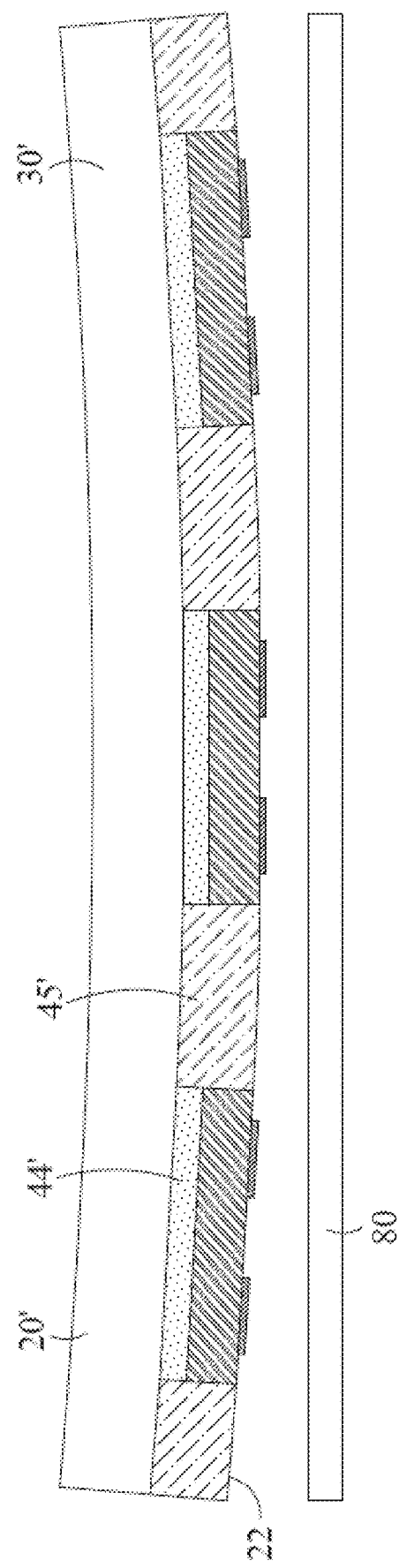
Figure 8F:
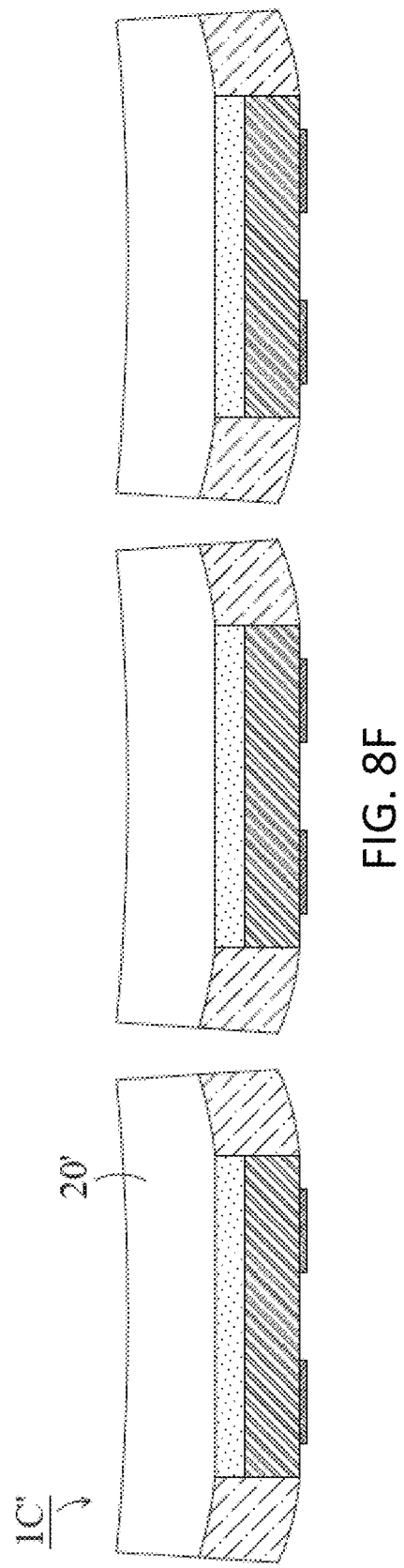

The cured upper resin member layer 30', the light-transmitting resin member layer 44', and the reflective resin member material 45' can form a connected array of the packaging structures 20'. Lastly, after the release layer 80 is removed as shown in FIG. 8E, the connected array of the packaging structure 20' having an upwardly warped lower surface 22 is separated through a singulation process so that a plurality of CSP LED devices 1C', corresponding to the LED device 1C shown in FIG. 3, are obtained as shown in FIG. 8F.

It will be appreciated that, in this embodiment of the manufacturing method illustrated by FIG. 8A to FIG. 8F according to the present disclosure, if the fabrication stage shown in FIG. 8D is omitted (namely, the upper supernatant resin material 30' is omitted), the fabricated CSP LED device corresponds to the LED device 1E shown in FIG. 5.

Furthermore, a process sequence to fabricate a CSP LED device corresponding to the CSP LED device 1B shown in FIG. 2 is described as follows. In the embodiment of the manufacturing method illustrated by FIG. 8A to FIG. 8F according to the present disclosure, after completing the fabrication stage shown in FIG. 8A and omitting the fabrication stage shown in FIG. 8B, the corresponding fabrication stage shown in FIG. 8C is used to form a reflective resin member material 45' selectively covering the edge surface 13 but not the upper surface 11 of the LED semiconductor die 10. After the reflective resin member material 45' is thermally cured, the light-transmitting resin member layer 44' is disposed adjoining both the upper surface 11 of the LED semiconductor die 10 and the upper surface of the reflective resin member material 45'. The subsequent fabrication stages illustrated in FIG. 8D to FIG. 8F follow accordingly. Thus, the fabricated CSP LED device corresponding to the CSP LED device 1B shown in FIG. 2 is therefore obtained. It will be appreciated that if the corresponding fabrication stage shown in FIG. 8D is omitted (namely, without the supernatant upper resin member layer 30'), the fabricated CSP LED device corresponds to the CSP LED device 1F shown in FIG. 6.

FIG. 9A to FIG. 9D show another fabrication sequence as another embodiment of the manufacturing method according to the present disclosure.

Figure 9A:
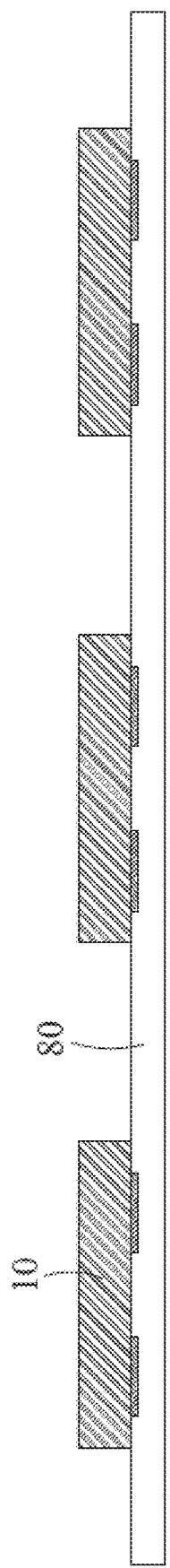
FIG. 9A, FIG. 9B, FIG. 9C, and FIG. 9D are schematic drawings of a manufacturing process to fabricate another CSP LED device according to another embodiment of the present disclosure.
Figure 9B:
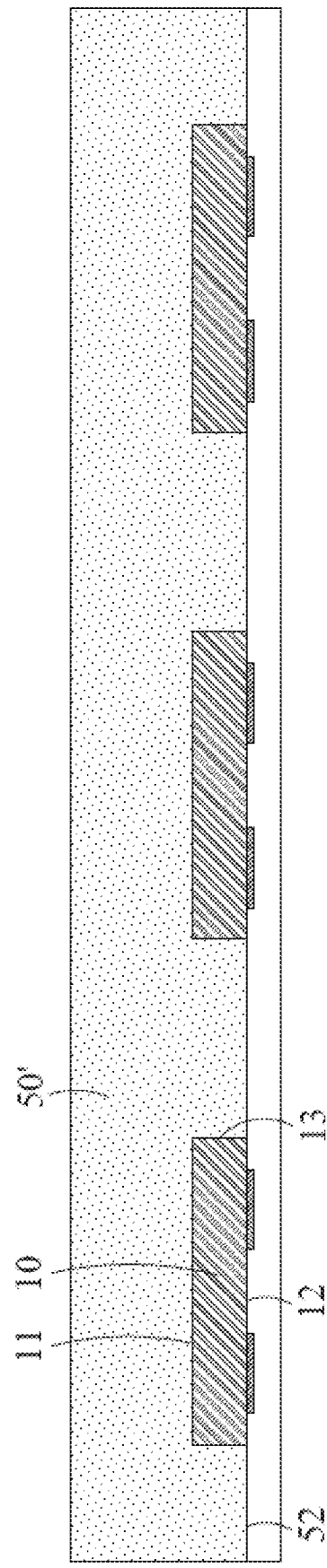

As shown in FIG. 9A, an array of LED semiconductor dies 10 is disposed on the release layer 80. Next, as shown in FIG. 9B, a thermal curing resin layer 50' is disposed covering the upper surface 11 and the edge surface 13 of each LED semiconductor die 10. Subsequently, the resin layer 50' is thermally cured causing volumetric shrinkage. The cured resin layer 50' corresponds to the single-layered resin member 50 of the LED device 1D shown in FIG. 4. In this fabrication stage, the lower surface 52 of the resin layer 50' is further deformed upwardly from the lower surface 12 of the semiconductor die 10 through the aforementioned first main warping mechanism to form a recessed space.

Figure 9C:
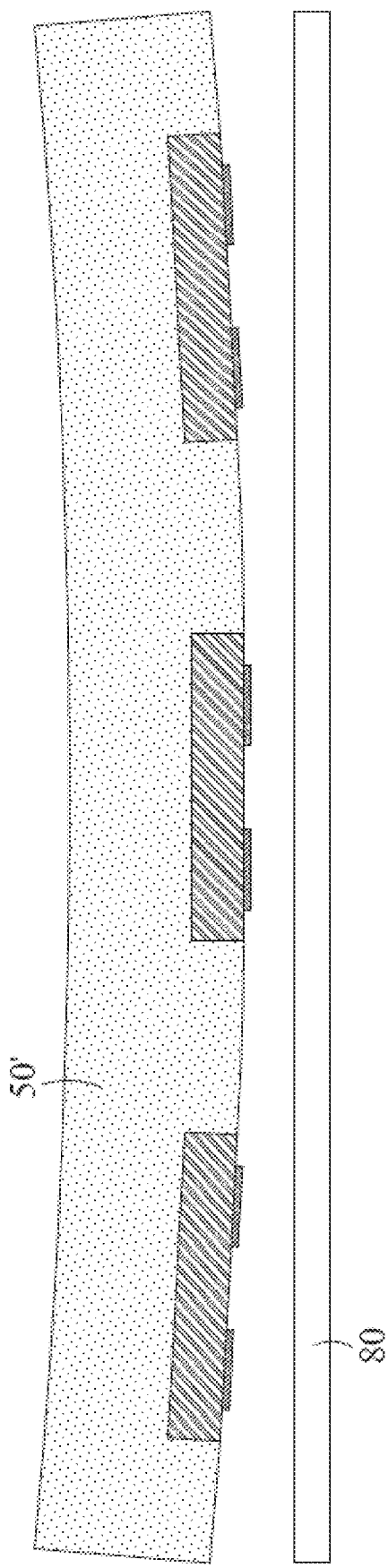
Figure 9D:
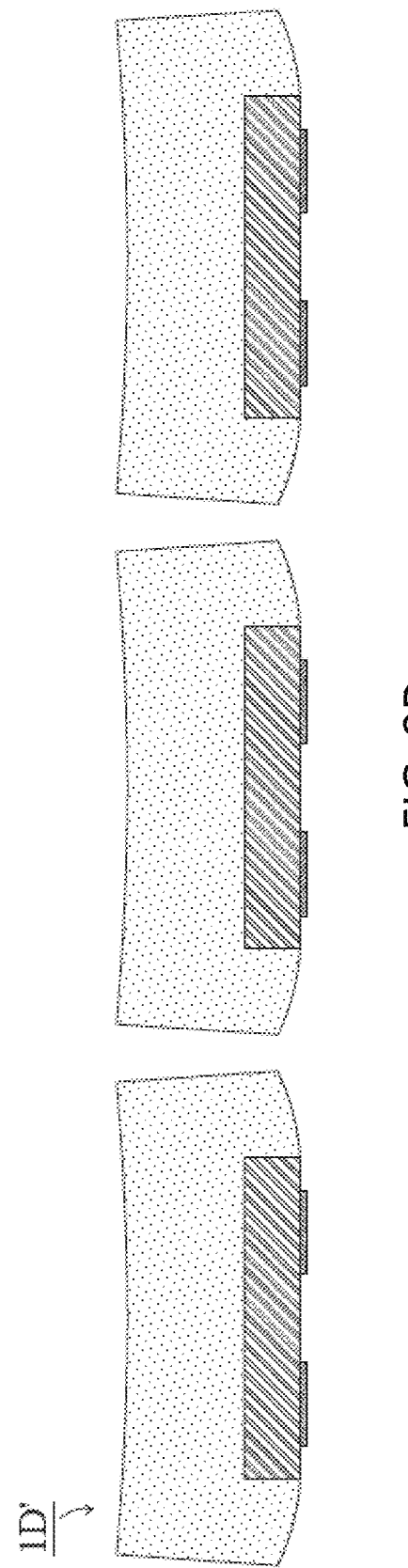

As shown in FIG. 9C, the release layer 80 is removed after the resin layer 50' is cured. Next, as shown in FIG. 9D, the resin layer 50' is separated through a singulation process so that a plurality of CSP LED devices 1D', corresponding to the CSP LED device 1D shown in FIG. 4, are obtained.

In view of the above, several embodiments of the manufacturing methods are disclosed to fabricate various CSP LED devices having an upwardly warped lower surface to form recessed spaces underneath. The disclosed methods are well suited for batch-type mass production processes.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A light emitting device comprising:
a flip-chip light emitting diode (LED) semiconductor die comprising an upper surface, a lower surface opposite to the upper surface, an edge surface, and a set of electrodes, wherein the edge surface extends between an outer rim of the upper surface of the LED semiconductor die and an outer rim of the lower surface of the LED semiconductor die, and the set of electrodes is disposed on the lower surface of the LED semiconductor die; and
a packaging structure covering the upper surface of the LED semiconductor die and the edge surface of the LED semiconductor die, wherein the packaging structure comprises an upper surface which is spaced from the upper surface of the LED semiconductor die, a lower surface which is opposite to the upper surface of the packaging structure and is gradually displaced upwardly from the outer rim of the lower surface of the LED semiconductor die, and an edge surface extending between the upper surface of the packaging structure and the lower surface of the packaging structure;
wherein the packaging structure comprises a lower resin member covering the upper surface of the LED semiconductor die and the edge surface of the LED semiconductor die, and an upper resin member disposed on the lower resin member,
wherein the edge surface of the packaging structure is displaced away from a perpendicular orientation with respect to the lower surface of the LED semiconductor die, and the edge surface of the packaging structure extends upwardly from a rim edge of the lower surface of the packaging structure and is inclined from the perpendicular orientation towards the LED semiconductor die from the rim edge of the lower surface of the packaging structure to the upper surface of the packaging structure.

2. The light emitting device according to claim 1, wherein the rim edge of the lower surface of the packaging structure has a horizontal distance from the edge surface of the LED semiconductor die and a vertical distance from the lower surface of the LED semiconductor die, and a ratio of the vertical distance divided by the horizontal distance is not less than 0.022.

3. The light emitting device according to claim 1, wherein a distance between the upper surface of the packaging structure and the upper surface of the LED semiconductor die ranges from 50 µm to 1000 µm.

4. The light emitting device according to claim 1, wherein the lower resin member includes a top portion covering the upper surface of the LED semiconductor die, an edge portion covering the edge surface of the LED semiconductor die, and an extension portion extending horizontally from the edge portion.

5. The light emitting device according to any one of claims 1 to 4, wherein the lower resin member is either a single-layered structure or a multi-layered structure, and the upper resin member is either a single-layered structure or a multi-layered structure.

6. The light emitting device according to any one of claims 1 to 4, wherein the packaging structure further comprises a photoluminescent material, light scattering particles, or both.

7. The light emitting device according to claim 1, wherein the lower resin member comprises a reflective resin member covering the edge surface of the LED semiconductor die, and a light-transmitting resin member disposed on and covering both the upper surface of the LED semiconductor die and an upper surface of the reflective resin member.

8. The light emitting device according to claim 1, wherein the lower resin member comprises a light-transmitting resin member covering the upper surface of the LED semiconductor die, and a reflective resin member covering both the edge surface of the LED semiconductor die and an edge surface of the light-transmitting resin member.

9. A light emitting device comprising:
a flip-chip light emitting diode (LED) semiconductor die comprising an upper surface, a lower surface opposite to the upper surface, an edge surface, and a set of electrodes, wherein the edge surface extends between the upper surface of the LED semiconductor die and the lower surface of the LED semiconductor die, and the set of electrodes is disposed on the lower surface of the LED semiconductor die; and
a packaging structure covering the upper surface and the edge surface of the LED semiconductor die, wherein the packaging structure comprises an upper surface which is spaced from the upper surface of the LED semiconductor die, a lower surface which is opposite to the upper surface of the packaging structure and is displaced upwardly from the lower surface of the LED semiconductor die, and an edge surface extending between the upper surface of the packaging structure and the lower surface of the packaging structure;
wherein a rim edge of the lower surface of the packaging structure has a horizontal distance from the edge surface of the LED semiconductor die and a vertical distance from the lower surface of the LED semiconductor die so that a ratio of the vertical distance divided by the horizontal distance is not less than 0.022,
wherein the edge surface of the packaging structure is displaced away from a perpendicular orientation with respect to the lower surface of the LED semiconductor die, and the edge surface of the packaging structure extends upwardly from the rim edge of the lower surface of the packaging structure and is inclined from the perpendicular orientation towards the LED semiconductor die from the rim edge of the lower surface of the packaging structure to the upper surface of the packaging structure.

10. The light emitting device according to claim 9, wherein the packaging structure comprises a light-transmitting resin member covering the upper surface of the LED semiconductor die, and a reflective resin member covering both the edge surface of the LED semiconductor die and an edge surface of the light-transmitting resin member.

11. The light emitting device according to claim 9, wherein the packaging structure comprises a reflective resin member covering the edge surface of the LED semiconductor die, and a light-transmitting resin member covering both the upper surface of the LED semiconductor die and an upper surface of the reflective resin member.

12. The light emitting device according to any one of claims 10 to 11, wherein the light-transmitting resin member further comprises a photoluminescent material, light scattering particles, or both.

13. The light emitting device according to claim 1, wherein the upper surface of the packaging structure has a concave curvature.

14. The light emitting device according to claim 1, wherein a Coefficient of Thermal Expansion (CTE) of the upper resin member is larger than a CTE of the lower resin member.

15. The light emitting device according to claim 9, wherein the lower surface of the packaging structure is gradually displaced upwardly from an outer rim of the lower surface of the LED semiconductor die.

16. The light emitting device according to claim 9, wherein the upper surface of the packaging structure has a concave curvature.

17. The light emitting device according to claim 9, wherein the packaging structure comprises a lower resin member covering the upper surface of the LED semiconductor die and the edge surface of the LED semiconductor die, and an upper resin member disposed on the lower resin member, and wherein a Coefficient of Thermal Expansion (CTE) of the upper resin member is larger than a CTE of the lower resin member.

18. The light emitting device according to claim 1, wherein the edge surface of the packaging structure forms an angle less than 90° with respect to the lower surface of the LED semiconductor die.

19. The light emitting device according to claim 9, wherein the edge surface of the packaging structure forms an angle less than 90° with respect to the lower surface of the LED semiconductor die.

* * * * *